US009493688B2

(12) United States Patent
Ishiguro et al.

(10) Patent No.: US 9,493,688 B2
(45) Date of Patent: *Nov. 15, 2016

(54) RESIN COMPOSITION AND MOLDED ARTICLE COMPRISING SAME

(71) Applicant: ZEON CORPORATION, Tokyo (JP)

(72) Inventors: Atsushi Ishiguro, Tokyo (JP); Ryuta Kurihara, Tokyo (JP); Youhei Koide, Tokyo (JP); Daido Chiba, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/443,115

(22) PCT Filed: Nov. 13, 2013

(86) PCT No.: PCT/JP2013/080651
§ 371 (c)(1),
(2) Date: May 15, 2015

(87) PCT Pub. No.: WO2014/077267
PCT Pub. Date: May 22, 2014

(65) Prior Publication Data
US 2015/0329750 A1 Nov. 19, 2015

(30) Foreign Application Priority Data

Nov. 15, 2012 (JP) .................. 2012-251506
Dec. 21, 2012 (JP) .................. 2012-279112

(51) Int. Cl.
C09J 153/00 (2006.01)
C09J 123/20 (2006.01)
C08L 53/02 (2006.01)
C08F 287/00 (2006.01)
C08L 51/00 (2006.01)
H01L 31/048 (2014.01)

(52) U.S. Cl.
CPC .......... C09J 153/005 (2013.01); C08F 287/00 (2013.01); C08L 51/00 (2013.01); C08L 53/02 (2013.01); C08L 53/025 (2013.01); C09J 123/20 (2013.01); H01L 31/048 (2013.01); C09J 2423/003 (2013.01); C09J 2453/003 (2013.01)

(58) Field of Classification Search
None
See application file for complete search history.

(56) References Cited

U.S. PATENT DOCUMENTS

| 4,783,504 A | 11/1988 | St. Clair et al. |
| 5,352,744 A | 10/1994 | Bates et al. |
| 2002/0147273 A1* | 10/2002 | Patel ............... A61F 13/4902 525/93 |
| 2002/0160137 A1* | 10/2002 | Varma ............ B65D 39/0017 428/35.7 |
| 2007/0135296 A1* | 6/2007 | Jacobsen ............ C08F 210/16 502/152 |
| 2010/0000600 A1 | 1/2010 | Hoya |
| 2013/0008506 A1 | 1/2013 | Tanahashi et al. |
| 2013/0244367 A1 | 9/2013 | Kohara et al. |

FOREIGN PATENT DOCUMENTS

| EP | 2 623 526 A1 | 8/2013 |
| JP | S57-196747 A | 12/1982 |
| JP | S58-132032 A | 8/1983 |
| JP | S62-218468 A | 9/1987 |
| JP | H04-198046 A | 7/1992 |
| JP | H06-299125 A | 10/1994 |
| JP | H09-30847 A | 2/1997 |
| JP | 2000-091610 A | 3/2000 |
| JP | 2000-091611 A | 3/2000 |
| JP | 2000-106450 A | 4/2000 |
| JP | 2001-044481 A | 2/2001 |
| WO | 94/21694 A1 | 9/1994 |
| WO | 2008/015984 A1 | 2/2008 |
| WO | 2009/151029 A1 | 12/2009 |
| WO | 2011/096389 A1 | 8/2011 |
| WO | 2012/043708 A1 | 4/2012 |

OTHER PUBLICATIONS

Yasuyuki Fujisaki, Nikkakyo Geppo (Japan Chemical Industry Association monthly), 35(10), pp. 28-38 (1982).
Jan. 14, 2014 Search Report issued in International Patent Application No. PCT/JP2013/080651.
May 19, 2015 International Preliminary Report on Patentability issued in Interntional Patent Application No. PCT/JP2013/080651.

* cited by examiner

Primary Examiner — Jeffrey Mullis
(74) Attorney, Agent, or Firm — Oliff PLC

(57) ABSTRACT

A resin composition including an alkoxysilyl group-containing hydrogenated block copolymer [3], and a hydrocarbon-based polymer [4] having a number average molecular weight of 300 to 5000, the resin composition including the hydrocarbon-based polymer [4] in an amount of 1 to 50 parts by weight based on 100 parts by weight of the alkoxysilyl group-containing hydrogenated block copolymer [3], the alkoxysilyl group-containing hydrogenated block copolymer [3] being obtained by introducing an alkoxysilyl group into a hydrogenated block copolymer [2] that is obtained by hydrogenating 90% or more of unsaturated bonds of a block copolymer [1] that includes at least two polymer blocks [A] and at least one polymer block [B], and a ratio (wA:wB) of a weight fraction wA of the polymer block [A] in the block copolymer [1] to a weight fraction wB of the polymer block [B] in the block copolymer [1] being 30:70 to 65:35.

17 Claims, 1 Drawing Sheet

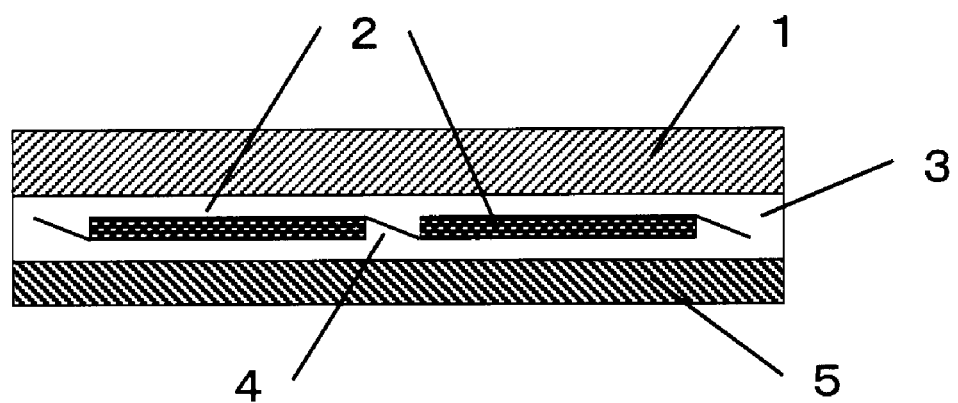

RESIN COMPOSITION AND MOLDED ARTICLE COMPRISING SAME

TECHNICAL FIELD

The present invention relates to a resin composition that exhibits low hygroscopicity, non-hydrolyzability, excellent weatherability, and excellent transparency, and also exhibits high adhesion to glass and a metal. More specifically, the invention relates to a resin composition that is useful as a sealing material that is used to seal a solar cell element included in a solar cell module, and exhibits flexibility that suppresses a situation in which cracks occur in a crystalline solar cell during a vacuum lamination process, and is also useful as an adhesive for laminated glass that exhibits excellent transparency and an excellent shatterproof capability, can be easily handled, exhibits excellent storage stability and the like, and exhibits low-temperature adhesion to glass, heat resistance, and light resistance in a well-balanced manner.

BACKGROUND ART

In recent years, a solar cell that utilizes clean energy has attracted attention, and various solar cell modules have been developed and proposed. A solar cell module that utilizes a monocrystalline or polycrystalline silicon-based element (device), a solar cell module that utilizes a thin-film amorphous silicon-based element, and the like have been the mainstream. As illustrated in FIG. 1, a solar cell module that utilizes such a silicon-based element typically includes (from the sunlight incident side) a transparent front substrate 1 (e.g., glass substrate), solar cell elements 2, a sealing material 3 that seals the solar cell elements 2, a tab wire 4 connected to the solar cell elements 2, and a back-side protective sheet 5.

A sealing material (EVA sealing material) that is obtained by crosslinking and curing an ethylene-vinyl acetate copolymer (EVA) using a crosslinking agent (e.g., organic peroxide), and exhibits excellent transparency and light resistance, has been widely used as the sealing material 3 that seals the solar cell elements.

However, since EVA includes a structural unit derived from vinyl acetate, EVA is easily hydrolyzed with the passage of time due to moisture and water that have entered from the outside to produce acetic acid. Acetic acid thus produced may come in contact with the wire and the electrode provided inside the cell, and accelerate corrosion.

In order to improve the durability of the solar cell by preventing a decrease in insulating properties due to entry of water into the solar cell, corrosion of the wire and the electrode, and the like, a method that stacks an inorganic oxide deposited layer on the back-side protective sheet as a barrier layer (e.g., Patent Document 1), a method that utilizes a cycloolefin-based resin sheet having a low water vapor transmission rate as the back-side protective sheet (e.g., Patent Documents 2 and 3), and the like have been proposed.

However, it is difficult to completely prevent entry of moisture and water into the solar cell using these methods. Therefore, a sealing material that exhibits low hygroscopicity and low water vapor permeability, and does not produce an acid due to hydrolysis, has been desired in order to remarkably improve the durability of the solar cell by preventing a decrease in insulating properties, and occurrence of corrosion.

A method that utilizes a sealing resin composition that includes an ethylene-α-olefin copolymer and a crosslinking agent instead of EVA (Patent Documents 4 and 5), a method that utilizes a propylene-based polymer and a specific propylene-based copolymer (Patent Document 6), and the like have been proposed in order to solve the problem in which the sealing material produces an acid due to hydrolysis. It is considered that the method that utilizes an ethylene-α-olefin copolymer, and the method that utilizes a propylene-based polymer and a specific propylene-based copolymer ensure that the resin exhibits low hygroscopicity and low water vapor permeability, and reduce the effects of production of an acid.

However, since the balance between the heat resistance and the flexibility of the resin is poor, and excellent heat resistance is not achieved in a state in which the resin is not crosslinked, it is difficult to produce a solar cell element sealing sheet having the desired properties without performing a crosslinking step.

Patent Document 7 discloses a hydrogenated block copolymer that is produced by introducing an alkoxysilyl group into a hydrogenated block copolymer that is obtained by hydrogenating 90% or more of the unsaturated bonds of a block copolymer that includes at least two polymer blocks [A] and at least one polymer block [B], the polymer block [A] including a repeating unit derived from an aromatic vinyl compound as the main component, the polymer block [B] including a repeating unit derived from a linear conjugated diene compound as the main component, and the ratio (wA:wB) of the weight fraction wA of the polymer block [A] in the block copolymer to the weight fraction wB of the polymer block [B] in the block copolymer being 20:80 to 60:40. Patent Document 7 states that the hydrogenated block copolymer disclosed in Patent Document 7 exhibits low hygroscopicity, non-hydrolyzability, weatherability, transparency, and flexibility, maintains high adhesion to glass even when subjected to a high-temperature/high-humidity environment for a long time, and can seal a solar cell element without applying a special waterproof treatment.

A polyvinyl butyral-based resin has been most widely used as an intermediate layer for laminated glass. However, the polyvinyl butyral-based resin has problems in that the glass sheet may be displaced, or air bubbles may occur after bonding due to heat since the polyvinyl butyral-based resin has a relatively low softening point, whitening may gradually occur from the peripheral area, and adhesion to glass may decrease when the laminated glass is subjected to a high-humidity atmosphere for a long time since the polyvinyl butyral-based resin has high hygroscopicity, and it is necessary to strictly manage the water content before bonding glass sheets in order to control adhesion to glass (e.g., Non-patent Document 1), for example.

In order to solve the above problems, Patent Document 8 proposes laminated glass that is obtained by providing a thermosetting resin obtained by adding an organic peroxide to an ethylene-vinyl acetate copolymer, between glass sheets, and thermally curing the thermosetting resin (thermosetting resin layer), and Patent Document 9 proposes laminated glass that is obtained by bonding glass sheets using an acid-modified saponified ethylene-vinyl acetate copolymer, for example. Since sufficient impact resistance and penetration resistance may not be achieved using an ethylene-vinyl acetate copolymer, Patent Document 10 proposes producing laminated glass using a thermosetting resin obtained by adding an organic peroxide and a silane coupling agent to a ternary block copolymer that includes end blocks formed of a polymer of an aromatic vinyl compound, and a middle (intermediate) block formed of a conjugated diene-based polymer, for example. However, since a thermosetting resin that includes an organic peroxide has inferior long-term storage stability, the thermosetting resin may not exhibit sufficient adhesion when bonding glass sheets depending on the storage conditions before bonding glass sheets.

Patent Document 11 discloses providing adhesion to a hydrogenated block copolymer that includes an aromatic alkene polymer block and a diene polymer block by adding an aliphatic hydrocarbon resin or the like. However, Patent Document 11 is silent about providing the hydrogenated block copolymer with adhesion to glass and the like.

RELATED-ART DOCUMENT

Patent Document

Patent Document 1: JP-A-2000-91610
Patent Document 2: JP-A-2000-106450
Patent Document 3: JP-A-2001-44481
Patent Document 4: JP-A-6-299125
Patent Document 5: JP-A-2000-91611
Patent Document 6: WO2008/015984 (US2010/0000600A1)
Patent Document 7: WO2012/043708
Patent Document 8: JP-A-57-196747
Patent Document 9: JP-A-4-198046
Patent Document 10: JP-A-9-030847
Patent Document 11: WO1994/021694 (U.S. Pat. No. 5,352,744)

Non-Patent Document

Non-patent Document 1: Yasuyuki Fujisaki, *Nikkakyo Geppo* (Japan Chemical Industry Association monthly), 35 (10), 28 (1982)

SUMMARY OF THE INVENTION

Technical Problem

A solar cell element is normally sealed by laminating a sheet-like sealing material on a crystalline solar cell under vacuum. When using an EVA sealing material, the sealing temperature is normally (preferably) set to 150° C. or less. It is preferable to lower the sealing temperature as much as possible in order to improve the production efficiency.

The inventors of the invention attempted to use the alkoxysilyl group-containing hydrogenated block copolymer disclosed in Patent Document 7 as a solar cell element sealing material, and found that it is necessary to set the sealing temperature to 160° C. or more in order to suppress occurrence of cracks in the solar cell while ensuring heat resistance at 120° C.

When using a polyvinyl butyral-based resin that has been widely used as an adhesive for laminated glass, the bonding temperature is normally about 120 to 140° C. When using an alkoxysilyl group-containing hydrogenated block copolymer as an adhesive for laminated glass, it is desirable that the bonding temperature be about 120 to 140° C.

The inventors attempted to use the alkoxysilyl group-containing hydrogenated block copolymer disclosed in Patent Document 4 as an adhesive for bonding laminated glass, and found that it is necessary to set the bonding temperature to 150° C. or more.

The inventors conducted further extensive studies, and found the following (see (1) and (2)) to complete the invention.

(1) A resin composition prepared by adding a specific amount of a hydrocarbon-based polymer having a specific molecular weight to the alkoxysilyl group-containing hydrogenated block copolymer disclosed in Patent Document 7, exhibits excellent transparency, and it is possible to seal a crystalline solar cell at a lower temperature while maintaining heat resistance, and preventing occurrence of cracks, by utilizing a sheet obtained using the resin composition.

(2) In particular, the resin composition that includes a hydrogenated (co)polymer of an olefin and/or a conjugated diene that has an iodine number equal to or smaller than a specific value as the hydrocarbon-based polymer, exhibits excellent transparency, and it is possible to bond glass at a lower temperature while maintaining heat resistance and excellent light resistance by utilizing a sheet obtained using the resin composition (i.e., it is possible to obtain a sheet that is suitable as an adhesive for laminated glass).

Solution to Problem

Several aspects of the invention provide the following resin composition (see (1) to (3)) and formed article (see (4) and (5)).

(1) A resin composition including an alkoxysilyl group-containing hydrogenated block copolymer [3], and a hydrocarbon-based polymer [4] having a number average molecular weight of 300 to 5000, the resin composition including the hydrocarbon-based polymer [4] in an amount of 1 to 50 parts by weight based on 100 parts by weight of the alkoxysilyl group-containing hydrogenated block copolymer [3], the alkoxysilyl group-containing hydrogenated block copolymer [3] being obtained by introducing an alkoxysilyl group into a hydrogenated block copolymer [2] that is obtained by hydrogenating 90% or more of unsaturated bonds of a block copolymer [1] that includes at least two polymer blocks [A] and at least one polymer block [B], the polymer block [A] including a repeating unit derived from an aromatic vinyl compound as the main component, the polymer block [B] including a repeating unit derived from a linear conjugated diene compound as the main component, and the ratio (wA:wB) of the weight fraction wA of the polymer block [A] in the block copolymer [1] to the weight fraction wB of the polymer block [B] in the block copolymer [1] being 30:70 to 65:35.

(2) The resin composition according to (1), wherein the hydrocarbon-based polymer [4] is at least one polymer selected from the group consisting of polyisobutylene, polybutene, poly-4-methylpentene, poly-1-octene, an ethylene-α-olefin copolymer, hydrogenated products thereof, an aliphatic hydrocarbon resin, a hydrogenated product thereof, an alicyclic hydrocarbon resin, a hydrogenated product thereof, polyisoprene, and a hydrogenated product thereof.

(3) The resin composition according to (1), wherein the hydrocarbon-based polymer [4] is a hydrogenated (co)polymer of an olefin and/or a conjugated diene that has an iodine number of 2.0 or less.

(4) A formed article obtained by forming the resin composition according to (1).

(5) The formed article according to (4), the formed article being a sheet-like formed article.

Advantageous Effects of the Invention

The resin composition according to one aspect of the invention exhibits excellent transparency, excellent heat resistance, excellent light resistance, low hygroscopicity, and low water vapor permeability, and can produce a formed article that exhibits high adhesion when melted by heating, and bonded to glass or a metal.

The sheet-like formed article formed of the resin composition according to one aspect of the invention can prevent occurrence of cracks in a crystalline solar cell during a vacuum lamination process when used as a solar cell element sealing material, maintain high adhesion to glass and a metal even when subjected to a high-temperature/high-humidity environment for a long time, and can seal a solar cell element without requiring a special waterproof treatment. Since the sheet exhibits sufficient heat resistance even when the sheet is not crosslinked and cured using a crosslinking agent (e.g., organic peroxide), a crosslinking step can be omitted when producing a solar cell.

When the resin composition according to one aspect of the invention includes the hydrogenated (co)polymer of an olefin and/or a conjugated diene that has an iodine number of 2.0 or less as the hydrocarbon-based polymer [4], the resin composition and the sheet-like formed article formed of the resin composition exhibit excellent transparency and an excellent shatterproof capability, can be easily handled, exhibit excellent storage stability and the like, and exhibit low-temperature adhesion to glass, heat resistance, and light resistance in a well-balanced manner. Therefore, it is possible to provide laminated glass that exhibits excellent durability. Moreover, it is unnecessary to perform a special treatment (e.g., water content adjustment) before applying the resin composition to glass (before bonding glass), and it is possible to directly use the resin composition that has been stored in a normal temperature/normal humidity environment for a long time. Therefore, it is easy to store and handle the resin composition.

BRIEF DESCRIPTION OF DRAWINGS

FIG. 1 is a schematic cross-sectional view illustrating a crystalline silicon-based solar cell module.

DESCRIPTION OF EMBODIMENTS

A resin composition according to one embodiment of the invention includes an alkoxysilyl group-containing hydrogenated block copolymer [3], and a hydrocarbon-based polymer [4] having a number average molecular weight of 300 to 5000, the resin composition including the hydrocarbon-based polymer [4] in an amount of 1 to 50 parts by weight based on 100 parts by weight of the alkoxysilyl group-containing hydrogenated block copolymer [3], the alkoxysilyl group-containing hydrogenated block copolymer [3] being obtained by introducing an alkoxysilyl group into a hydrogenated block copolymer [2] that is obtained by hydrogenating 90% or more of unsaturated bonds of a block copolymer [1] that includes at least two polymer blocks [A] and at least one polymer block [B], the polymer block [A] including a repeating unit derived from an aromatic vinyl compound as the main component, the polymer block [B] including a repeating unit derived from a linear conjugated diene compound as the main component, and the ratio (wA:wB) of the weight fraction wA of the polymer block [A] in the block copolymer [1] to the weight fraction wB of the polymer block [B] in the block copolymer [1] being 30:70 to 65:45.

1. Block Copolymer [1]

The block copolymer [1] used in connection with one embodiment of the invention includes at least two polymer blocks [A] and at least one polymer block [B], the ratio (wA:wB) of the weight fraction wA of the polymer block [A] in the block copolymer [1] to the weight fraction wB of the polymer block [B] in the block copolymer [1] being 30:70 to 65:45.

(1-1) Polymer Block [A]

The polymer block [A] includes a repeating unit (structural unit) derived from an aromatic vinyl compound as the main component. The content of the repeating unit derived from the aromatic vinyl compound in the polymer block [A] is normally 90 wt % or more, preferably 95 wt % or more, and more preferably 99 wt % or more. If the content of the repeating unit derived from the aromatic vinyl compound in the polymer block [A] is too low, the resulting resin composition and a formed article obtained using the resin composition may exhibit low heat resistance.

The polymer block [A] may include a repeating unit derived from a linear conjugated diene and/or a repeating unit derived from an ethylenically unsaturated compound as a component other than the repeating unit derived from the aromatic vinyl compound. The content of these repeating units in the polymer block [A] is normally 10 wt % or less, preferably 5 wt % or less, and more preferably 1 wt % or less.

A plurality of polymer blocks [A] may be either identical or different as long as the above range is satisfied.

(1-2) Polymer Block [B]

The polymer block [B] includes a repeating unit derived from a linear conjugated diene compound as the main component. The content of the repeating unit derived from the linear conjugated diene compound in the polymer block [B] is normally 90 wt % or more, preferably 95 wt % or more, and more preferably 99 wt % or more. When the content of the repeating unit derived from the linear conjugated diene compound is within the above range, the resulting resin composition and a formed article obtained using the resin composition exhibit excellent flexibility. In particular, an excellent sealing capability is achieved when the resulting sheet-like formed article is used to seal a solar cell element, and the balance between impact resistance and low-temperature adhesion is improved when the resulting sheet-like formed article is used for laminated glass.

The polymer block [B] may include a repeating unit derived from an aromatic vinyl compound and/or a repeating unit derived from an ethylenically unsaturated compound as a component other than the repeating unit derived from the linear conjugated diene compound. The content of these repeating units in the polymer block [B] is normally 10 wt % or less, preferably 5 wt % or less, and more preferably 1 wt % or less. If the content of the repeating unit derived from the aromatic vinyl compound and/or the repeating unit derived from the ethylenically unsaturated compound in the polymer block [B] is too high, the resulting resin composition and a formed article obtained using the resin composition may exhibit insufficient flexibility, and the resulting sheet-like formed article may exhibit an insufficient capability to seal a solar cell element, or impact resistance may decrease when the resulting sheet-like formed article is used for laminated glass.

When the block copolymer [1] includes a plurality of polymer blocks [B], the plurality of polymer blocks [B] may be either identical or different as long as the above range is satisfied.

Examples of the aromatic vinyl compound used to produce the block copolymer [1] include styrene; an alkyl group-substituted styrene such as α-methylstyrene, 3-methylstyrene, 4-methylstyrene, 2,4-diisopropylstyrene, 2,4-dimethylstyrene, 4-t-butylstyrene, and 5-t-butyl-2-methylstyrene; a halogen atom-substituted styrene such as 4-chlorostyrene, 2-fluorostyrene, and 2,4-dichlorostyrene; an alkoxy group-substituted styrene such as 3-methoxystyrene, 4-methoxystyrene, 3,5-dimethoxystyrene, and 4-t-butoxystyrene; and the like. Among these, styrene and an alkyl group-substituted styrene that do not include a polar group are preferable from the viewpoint of hygroscopicity, and styrene is particularly preferable from the viewpoint of industrial availability.

A linear conjugated diene compound that does not include a polar group (e.g., 1,3-butadiene, isoprene, 2,3-dimethyl-1,3-butadiene, and 1,3-pentadiene) is preferable as the linear conjugated diene compound from the viewpoint of hygroscopicity. 1,3-Butadiene and isoprene are particularly preferable as the linear conjugated diene compound due to excellent polymerization controllability.

Examples of the ethylenically unsaturated compound include a linear ethylenically unsaturated compound and a cyclic ethylenically unsaturated compound. These ethylenically unsaturated compounds may be substituted with a nitrile group, an alkoxycarbonyl group, a carboxyl group, an acid anhydride group, or a halogen atom (group). An ethylenically unsaturated compound that does not include a polar group, such as a linear olefin (e.g., ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene) and a cyclic olefin (e.g., vinylcyclohexane) is preferable as the ethylenically unsaturated compound from the viewpoint of hygroscopicity, a linear olefin is more preferable, and ethylene and propylene are particularly preferable.

(1-3) Block Copolymer [1]

The number of polymer blocks [A] included in the block copolymer [1] is normally 4 or less, preferably 3 or less, and more preferably 2 or less. The number of polymer blocks [B] included in the block copolymer [1] is normally 3 or less, preferably 2 or less, and more preferably 1.

When the block copolymer [1] includes a plurality of polymer blocks [A], the ratio (Mw(A1)/Mw(A2)) of the highest weight average molecular weight Mw(A1) to the lowest weight average molecular weight Mw(A2) among the weight average molecular weights of the plurality of polymer blocks [A] is preferably 2.0 or less, more preferably 1.5 or less, and still more preferably 1.2 or less.

When the block copolymer [1] includes a plurality of polymer blocks [B], the ratio (Mw(B1)/Mw(B2)) of the highest weight average molecular weight Mw(B1) to the lowest weight average molecular weight Mw(B2) among the weight average molecular weights of the plurality of polymer blocks [B] is preferably 2.0 or less, more preferably 1.5 or less, and still more preferably 1.2 or less.

The block copolymer [1] may be a linear block copolymer or a radial block copolymer. It is preferable that the block copolymer [1] be a linear block copolymer since the block copolymer [1] exhibits excellent mechanical strength. Examples of the linear block copolymer include an [A]-[B]-[A] triblock copolymer, an [A]-[B]-[A]-[B] tetrablock copolymer, an [A]-[B]-[A]-[B]-[A] or [B]-[A]-[B]-[A]-[B] pentablock copolymer, and the like. Among these, an [A]-[B]-[A] triblock copolymer is particularly preferable.

The ratio (wA:wB) of the weight fraction wA of the polymer block [A] in the block copolymer [1] to the weight fraction wB of the polymer block [B] in the block copolymer [1] is normally 30:70 to 65:35, preferably 40:60 to 60:40, and more preferably 45:55 to 55:45.

When the ratio (wA:wB) is within the above range, moderate heat resistance and flexibility are obtained. In particular, an excellent sealing capability is achieved when the resin composition is used as a solar cell element sealing material, and laminated glass that exhibits excellent thermal shock resistance and an excellent shatterproof capability is obtained when the resin composition is used as an adhesive material for laminated glass.

The polystyrene-equivalent weight average molecular weight (Mw) of the block copolymer [1] determined by gel permeation chromatography (GPC) using tetrahydrofuran (THF) as a solvent is normally 35,000 to 200,000, preferably 40,000 to 150,000, and more preferably 45,000 to 100,000. The molecular weight distribution (Mw/Mn) of the block copolymer [1] is preferably 3 or less, more preferably 2 or less, and particularly preferably 1.5 or less.

When producing the block copolymer [1] that includes three polymer blocks, for example, the block copolymer [1] may be produced using a method that includes a first step that polymerizes a monomer (a1) that includes an aromatic vinyl compound (i.e., a monomer that produces the polymer block [A]) by living anionic polymerization or the like, a second step that polymerizes a monomer (b1) that includes a linear conjugated diene compound (i.e., a monomer that produces the polymer block [B]), and a third step that polymerizes a monomer (a2) that includes an aromatic vinyl compound (i.e., a monomer that produces the polymer block [A]) (the monomer (a1) and the monomer (a2) may be either identical or different); a method that includes a first step that polymerizes a monomer (a1) that includes an aromatic vinyl compound (i.e., a monomer that produces the polymer block [A]), a second step that polymerizes a monomer (b1) that includes a linear conjugated diene compound (i.e., a monomer that produces the polymer block [B]), and a third step that couples the ends of the resulting polymer block [B] using a coupling agent; or the like. The monomer (a1), the monomer (a2), and the monomer (b1) may respectively be a monomer mixture (a1), a monomer mixture (a2), and a monomer mixture (b1) (hereinafter the same).

When producing the block copolymer [1] that includes five polymer blocks, the block copolymer [1] may be produced using a method that includes a first step that polymerizes a monomer (a1) that includes an aromatic vinyl compound as the main component (i.e., a monomer that produces the polymer block [A]), a second step that polymerizes a monomer (b1) that includes a linear conjugated diene compound as the main component (i.e., a monomer that produces the polymer block [B]), a third step that polymerizes a monomer (a2) that includes an aromatic vinyl compound as the main component (i.e., a monomer that produces the polymer block [A]) (the monomer (a1) and the monomer (a2) may be either identical or different), a fourth step that polymerizes a monomer (b2) that includes a linear conjugated diene compound as the main component (i.e., a monomer that produces the polymer block [B]) (the monomer (b1) and the monomer (b2) may be either identical or different), and a fifth step that polymerizes a monomer (a3) that includes an aromatic vinyl compound as the main component (i.e., a monomer that produces the polymer block [A]) (the monomer (a1), the monomer (a2), and the monomer (a3) may be either identical or different); a method that includes a first step that polymerizes a monomer (a1) that includes an aromatic vinyl compound as the main component (i.e., a monomer that produces the polymer block [A]), a second step that polymerizes a monomer (b1) that includes a linear conjugated diene compound as the main component (i.e., a monomer that produces the polymer block [B]), and a third step that couples the ends of the resulting polymer block [B] using a tetrafunctional coupling agent (i.e., four polymer blocks [A] and one polymer block [B] are bonded radially) to obtain a block copolymer that includes five polymer blocks; or the like. The monomer (a3) and the monomer (b2) may respectively be a monomer mixture (a3) and a monomer mixture (b2).

2. Hydrogenated Block Copolymer [2]

The hydrogenated block copolymer [2] used in connection with one embodiment of the invention is obtained by hydrogenating the carbon-carbon unsaturated bonds of the main chain, the side chain, and the aromatic ring of the block copolymer [1]. The hydrogenation ratio of the hydrogenated block copolymer [2] is normally 90% or more, preferably 97% or more, and more preferably 99% or more. The resulting resin composition and a formed article obtained using the resin composition exhibit better transparency, weatherability, and heat resistance as the hydrogenation ratio increases. The hydrogenation ratio of the hydrogenated block copolymer [2] may be determined from $^1$H-NMR data measured using the hydrogenated block copolymer [2].

The unsaturated bonds may be hydrogenated using an arbitrary method. The unsaturated bonds may be hydrogenated using a known method. It is preferable to use a hydrogenation method that can achieve a high hydrogenation ratio, and suppress occurrence of a polymer chain cleavage reaction. For example, the method described in WO2011/096389, WO2012/043708, or the like may be used.

The hydrogenated block copolymer [2] may be collected from a reaction solution including the hydrogenated block copolymer [2] after removing a hydrogenation catalyst and/or a polymerization catalyst. The hydrogenated block copolymer [2] thus collected may be pelletized, and subjected to the subsequent alkoxysilyl group introduction reaction, for example.

The polystyrene-equivalent weight average molecular weight (Mw) of the hydrogenated block copolymer [2] determined by GPC using THF as a solvent is normally 35,000 to 200,000, preferably 40,000 to 150,000, and more preferably 45,000 to 100,000. The molecular weight distribution (Mw/Mn) of the hydrogenated block copolymer [2] is preferably 3 or less, more preferably 2 or less, and particularly preferably 1.5 or less. When the Mw and the molecular weight distribution (Mw/Mn) of the hydrogenated block copolymer [2] are within the above ranges, a formed article obtained using the resin composition according to one embodiment of the invention exhibits improved mechanical strength and heat resistance.

3. Alkoxysilyl Group-Containing Hydrogenated Block Copolymer [3]

The alkoxysilyl group-containing hydrogenated block copolymer [3] used in connection with one embodiment of the invention is obtained by introducing an alkoxysilyl group into the hydrogenated block copolymer [2]. The alkoxysilyl group may be bonded directly to the hydrogenated block copolymer [2], or may be bonded to the hydrogenated block copolymer [2] through a divalent organic group (e.g., alkylene group).

The alkoxysilyl group may be introduced into the hydrogenated block copolymer [2] using an arbitrary method. It is preferable to introduce the alkoxysilyl group into the hydrogenated block copolymer [2] by reacting the hydrogenated block copolymer [2] and an ethylenically unsaturated silane compound in the presence of a peroxide.

The alkoxysilyl group is normally introduced in an amount of 0.1 to 10 parts by weight, preferably 0.2 to 5 parts by weight, and more preferably 0.3 to 3 parts by weight, based on 100 parts by weight of the hydrogenated block copolymer [2]. If the amount of the alkoxysilyl groups introduced into the hydrogenated block copolymer [2] is too large, the alkoxysilyl groups that have been decomposed due to a small amount of water or the like may be crosslinked to a large extent, and adhesion to glass and a metal may decrease. If the amount of the alkoxysilyl groups introduced into the hydrogenated block copolymer [2] is too small, sufficient adhesion to glass and a metal may not be obtained. The presence or absence (introduction) of the alkoxysilyl group may be determined by measuring the IR spectrum of the resulting hydrogenated block copolymer [3]. The amount of the alkoxysilyl groups introduced may be determined from $^1$H-NMR data measured using the resulting hydrogenated block copolymer [3].

The ethylenically unsaturated silane compound is not particularly limited as long as the ethylenically unsaturated silane compound undergoes graft polymerization with the hydrogenated block copolymer [2] to introduce the alkoxysilyl group into the hydrogenated block copolymer [2]. Examples of a preferable ethylenically unsaturated silane compound include a vinyltrialkoxysilane such as vinyltrimethoxysilane and vinyltriethoxysilane; an allyltrialkoxysilane such as allyltrimethoxysilane and allyltriethoxysilane; a dialkoxyalkylvinylsilane such as dimethoxymethylvinylsilane and diethoxymethylvinylsilane; a p-styryltrialkoxysilane such as p-styryltrimethoxysilane and p-styryltriethoxysilane; a (meth)acryloxyalkyltrialkoxysilane such as 3-methacryloxypropylmethyldimethoxysilane, 3-methacryloxypropyltrimethoxysilane, and 3-acryloxypropyltrimethoxysilane; and the like.

These ethylenically unsaturated silane compuns may be used either alone or in combination. The ethylenically unsaturated silane compound is normally used in an amount of 0.1 to 10 parts by weight, preferably 0.2 to 5 parts by weight, and more preferably 0.3 to 3 parts by weight, based on 100 parts by weight of the hydrogenated block copolymer [2].

A peroxide having a one-minute half-life temperature of 170 to 190° C. is preferably used as the peroxide. For example, it is preferable to use t-butylcumyl peroxide, dicumyl peroxide, di-t-hexyl peroxide, 2,5-dimethyl-2,5-di (t-butylperoxy)hexane, di-t-butyl peroxide, or the like.

These peroxides may be used either alone or in combination. The peroxide is normally used in an amount of 0.05 to 2 parts by weight, preferably 0.1 to 1 part by weight, and more preferably 0.2 to 0.5 parts by weight, based on 100 parts by weight of the hydrogenated block copolymer [2].

The hydrogenated block copolymer [2] and the ethylenically unsaturated silane compound may be reacted in the presence of the peroxide using an arbitrary method. For example, a mixture that includes the hydrogenated block copolymer [2], the ethylenically unsaturated silane compound, and the peroxide may be kneaded at the desired temperature for the desired time using a twin-screw kneader to introduce the alkoxysilyl group into the hydrogenated block copolymer [2].

The temperature when kneading the mixture using a twin-screw kneader is normally 180 to 220° C., preferably 185 to 210° C., and more preferably 190 to 200° C. The heating/kneading time is normally about 0.1 to 10 minutes, preferably about 0.2 to 5 minutes, and more preferably about 0.3 to 2 minutes. The mixture may be continuously kneaded and extruded so that the residence time falls within the above range.

The molecular weight of the alkoxysilyl group-containing hydrogenated block copolymer [3] is substantially identical with that of the hydrogenated block copolymer [2] used as the raw material since only a small amount of alkoxysilyl groups are introduced into the hydrogenated block copolymer [2]. However, since the hydrogenated block copolymer [2] is reacted with the ethylenically unsaturated silane compound in the presence of the peroxide, the polymer may undergo a crosslinking reaction and a cleavage reaction, and the molecular weight distribution (Mw/Mn) may increase.

The molecular weight distribution (Mw/Mn) of the alkoxysilyl group-containing hydrogenated block copolymer [3] is normally 3.5 or less, and preferably 2.5 or less, and particularly preferably 2.0 or less. When the Mw and the molecular weight distribution (Mw/Mn) of the alkoxysilyl group-containing hydrogenated block copolymer [3] are within the above ranges, a formed article obtained using the resin composition according to one embodiment of the invention maintains excellent mechanical strength and tensile elongation.

The alkoxysilyl group-containing hydrogenated block copolymer [3] thus obtained exhibits improved adhesion to glass, a metal, and the like. When a resin composition obtained using the alkoxysilyl group-containing hydrogenated block copolymer [3], or a sheet-like formed article obtained using the resin composition is used as a solar cell sealing material, the surface of the solar cell sealing material exhibits high adhesion to a glass substrate, a copper wire, solder, and the like. Therefore, the solar cell sealing material can maintain sufficient adhesion even when subjected to a high-temperature/high-humidity environment at 85° C. and 85% RH for 1000 hours (i.e., normal solar cell reliability evaluation conditions), and can be applied advantageously.

4. Hydrocarbon-Based Polymer [4]

The hydrocarbon-based polymer [4] used in connection with one embodiment of the invention has a number average molecular weight of 300 to 5000, and improves the melt fluidity of the resin composition that includes the alkoxysilyl group-containing hydrogenated block copolymer [3] and the hydrocarbon-based polymer [4] without impairing the heat resistance of the resin composition to a large extent.

Specific examples of the hydrocarbon-based polymer [4] include at least one polymer selected from the group consisting of polyisobutylene, polybutene, poly-4-methylpentene, poly-1-octene, an ethylene-α-olefin copolymer, hydrogenated products thereof, an aliphatic hydrocarbon resin, a hydrogenated product thereof, an alicyclic hydrocarbon resin, a hydrogenated product thereof, polyisoprene, and a hydrogenated product thereof. The hydrocarbon-based polymer [4] may include a polar group such as an alkoxysilyl group, an ester group, a hydroxyl group, an amide group, an amino group, and an acid anhydride group. Among these, polyisobutylene, polybutene, hydrogenated polyisobutylene, and hydrogenated polyisoprene are preferable since a resin composition that exhibits excellent transparency can be obtained.

The polystyrene-equivalent number average molecular weight (Mn) of the hydrocarbon-based polymer [4] determined by GPC using THF as a solvent is normally 300 to 5000, preferably 400 to 4000, and more preferably 500 to 3000. When the number average molecular weight of the hydrocarbon-based polymer [4] is within this range, it is possible to suppress occurrence of air bubbles during melt forming (molding), and the resin composition can be bonded to glass at a low temperature.

When using the resin composition according to one embodiment of the invention as an adhesive for laminated glass, it is possible to improve adhesion of the resin composition that includes the alkoxysilyl group-containing hydrogenated block copolymer [3] and the hydrocarbon-based polymer [4] to glass at a low temperature without impairing the heat resistance of the resin composition to a large extent when a hydrogenated (co)polymer of an olefin and/or a conjugated diene that has an iodine number of 2.0 or less is used as the hydrocarbon-based polymer [4].

Specific examples of the hydrogenated (co)polymer of an olefin and/or a conjugated diene include hydrogenated homopolymers or copolymers of isobutene, 1-butene, 4-methylpentene, 1-octene, butadiene, isoprene, and the like. Among these, a hydrogenated homopolymer or copolymer of isobutene is preferable since a resin composition that exhibits excellent transparency and light resistance can be obtained.

The iodine number of the hydrogenated (co)polymer of an olefin and/or a conjugated diene is preferably 2.0 or less, more preferably 0.1 or less, and still more preferably 0.5 or less. The term "iodine number" used herein refers to the amount (g) of iodine that reacts with 100 g of the hydrogenated (co)polymer of an olefin and/or a conjugated diene. If the iodine number of the hydrogenated (co)polymer of an olefin and/or a conjugated diene exceeds 2.0, the light resistance of the resin composition may deteriorate.

The iodine number is measured using the Wijs method that uses a 10% cyclohexane solution of the hydrogenated (co)polymer of an olefin and/or a conjugated diene, and iodine monochloride.

The polystyrene-equivalent number average molecular weight (Mn) of the hydrogenated (co)polymer of an olefin and/or a conjugated diene determined by GPC using THF as a solvent is normally 500 to 5000, preferably 800 to 4000, and more preferably 1000 to 3000. If the number average molecular weight (Mn) of the hydrogenated (co)polymer of an olefin and/or a conjugated diene is less than 500, air bubbles may be formed when melt forming (molding) the resin composition according to one embodiment of the invention. If the number average molecular weight (Mn) of the hydrogenated (co)polymer of an olefin and/or a conjugated diene exceeds 5000, the effect of decreasing the glass bonding temperature may deteriorate.

5. Resin Composition

The resin composition according to one embodiment of the invention is obtained by mixing the hydrocarbon-based polymer [4] with the alkoxysilyl group-containing hydrogenated block copolymer [3] in an amount of normally 1 to 50 parts by weight, preferably 2 to 40 parts by weight, and more preferably 4 to 30 parts by weight, based on 100 parts by weight of the alkoxysilyl group-containing hydrogenated block copolymer [3]. If the amount of the hydrocarbon-based polymer [4] exceeds 50 parts by weight, the heat resistance of the resin composition and a formed article obtained using the resin composition may decrease. If the amount of the hydrocarbon-based polymer [4] is less than 1 part by weight, it may be difficult to improve the fluidity of the resin composition. In this case, when a crystalline solar cell is sealed using a sheet-like formed article obtained using the resin composition, it may be difficult to prevent occurrence of cracks in the cell. Moreover, the effect of decreasing the glass bonding temperature may deteriorate.

The hydrocarbon-based polymer [4] may be mixed with the alkoxysilyl group-containing hydrogenated block copolymer [3] using a method that adds a solution prepared by dissolving a given amount of the hydrocarbon-based polymer [4] in an appropriate solvent to a solution of the hydrogenated block copolymer [2], removes the solvent to collect the hydrogenated block copolymer [2] including the hydrocarbon-based polymer [4], and reacts the hydrogenated block copolymer [2] with the ethylenically unsaturated silane compound in the presence of the peroxide; a method that melts the hydrogenated block copolymer [2] using a twin-screw kneader, a roll, a Brabender, an extruder, or the like, and adds a given amount of the hydrocarbon-based polymer [4] to the molten hydrogenated block copolymer [2], kneads the mixture, and reacts the resulting composition with the ethylenically unsaturated silane compound in the presence of the peroxide; a method that melts the alkoxysilyl group-containing hydrogenated block copolymer [3] using a twin-screw kneader, a roll, a Brabender, an extruder, or the like, adds a given amount of the hydrocarbon-based polymer [4] to the molten alkoxysilyl group-containing hydrogenated block copolymer [3], and kneads the mixture; a method that kneads and reacts the hydrogenated block copolymer [2] with the ethylenically unsaturated silane compound in the presence of the peroxide and the hydrocarbon-based polymer [4]; or the like.

6. Additive

A light stabilizer that improves light resistance, heat resistance, and the like, a UV absorber, an antioxidant, a lubricant, an inorganic filler, and the like may be added to the resin composition according to one embodiment of the invention either alone or in combination.

Light Stabilizer

A hindered amine-based light stabilizer is preferable as the light stabilizer. Examples of the hindered amine-based light stabilizer include a compound that includes a 3,5-di-t-butyl-4-hydroxyphenyl group in the structure, a compound that includes a 2,2,6,6-tetramethylpiperidyl group in the structure, a compound that includes a 1,2,2,6,6-pentamethyl-4-piperidyl group in the structure, and the like.

Among these, an N,N'-bis(2,2,6,6-tetramethyl-4-N-methylpiperidyl)-N,N'-diformyl-alkylenediamine, an N,N'-bis(2,2,6,6-tetramethyl-4-piperidyl)-N,N'-diformylalkylenediamine, an N,N'-bis(2,2,6,6-tetramethyl-4-piperidyl)-N,N'-bisalkylenefatty acid amide, and poly[[6-(1,1,3,3-tetramethylbutyl)amino-1,3,5-triazine-2,4-diyl]][(2,2,6,6-tetramethyl-4-piperidyl)imino]hexamethylene[(2,2,6,6-tetramethyl-4-piperidyl)imino]] are preferable due to excellent light resistance, and an N,N'-bis(2,2,6,6-tetramethyl-4-piperidyl)-N,N'-diformylalkylenediamine, a reaction product of a polymer of N,N'-bis(2,2,6,6-tetramethyl-4-piperidinyl)-1,6-hexanediamine and 2,4,6-trichloro-1,3,5-triazine, N-butyl-1-butaneamine, and N-butyl-2,2,6,6-tetramethyl-4-piperidineamine, and the like are more preferable.

The hindered amine-based light stabilizer is normally used in an amount of 0.001 to 2 parts by weight, preferably 0.002 to 1 part by weight, and more preferably 0.005 to 0.5 parts by weight, based on 100 parts by weight of the alkoxysilyl group-containing hydrogenated block copolymer [3]. If the amount of the hindered amine-based light stabilizer is less than 0.001 parts by weight, the resin composition and a formed article obtained using the resin composition may exhibit insufficient light resistance. If the amount of the hindered amine-based light stabilizer is more than 2 parts by weight, a T-die or a cooling roll of an extruder may be contaminated to a large extent when melt-forming (melt-molding) the resin composition.

UV Absorber

Examples of the UV absorber include a benzophenone-based UV absorber, a salicylate-based UV absorber, a benzotriazole-based UV absorber, and the like.

Specific examples of the UV absorber include a benzophenone-based UV absorber such as 2,4-dihydroxybenzophenone, 2-hydroxy-4-methoxybenzophenone, 2-hydroxy-1-methoxybenzophenone-5-sulfonic acid trihydrate, 2-hydroxy-4-octyloxybenzophenone, 4-dodecaoxy-2-hydroxybenzophenone, 4-benzyloxy-2-hydroxybenzophenone, 2,2',4,4'-tetrahydroxybenzophenone, and 2,2'-dihydroxy-4,4'-dimethoxybenzophenone; a salicylate-based UV absorber such as phenyl salicylate, 4-t-butylphenyl 2-hydroxybenzoate, phenyl 2-hydroxybenzoate, 2,4-di-t-butylphenyl 3,5-di-t-butyl-4-hydroxybenzoate, and hexadecyl 3,5-di-t-butyl-4-hydroxybenzoate; a benzotriazole-based UV absorber such as 2-(2-hydroxy-5-methylphenyl)-2H-benzotriazole, 2-(3-t-butyl-2-hydroxy-5-methylphenyl)-5-chloro-2H-benzotriazole, 2-(3,5-di-t-butyl-2-hydroxyphenyl)-5-chloro-2H-benzotriazole, 2-(3,5-di-t-butyl-2-hydroxyphenyl)-2H-benzotriazole, 5-chloro-2-(3,5-di-t-butyl-2-hydroxyphenyl)-2H-benzotriazole, 2-(3,5-di-t-amyl-2-hydroxyphenyl)-2H-benzotriazole, 2-(2-hydroxy-5-t-octylphenyl)-2H-benzotriazole, 2-(2-hydroxy-4-octylphenyl)-2H-benzotriazole, 2-(2H-benzotriazol-2-yl)-4-methyl-6-(3,4,5,6-tetrahydrophthalimidylmethyl)phenol, and 2,2'-methylenebis[4-(1,1,3,3-tetramethylbutyl)-6-[(2H-benzotriazol-2-yl)phenol]]; and the like.

The UV absorber is normally used in an amount of 0.01 to 2 parts by weight, preferably 0.02 to 1.5 parts by weight, and more preferably 0.04 to 1.0 part by weight, based on 100 parts by weight of the alkoxysilyl group-containing hydrogenated block copolymer [3]. If the amount of the UV absorber is less than 0.01 parts by weight, the resin composition and a formed article obtained using the resin composition may exhibit insufficient light resistance. A further improvement is not achieved when the UV absorber is used in an amount of more than 2 parts by weight.

Antioxidant

A further improvement in thermal stability can be achieved by adding the antioxidant to the resin composition in addition to the hindered amine-based light stabilizer and the UV absorber. Examples of the antioxidant include a phosphorus-based antioxidant, a phenol-based antioxidant, a sulfur-based antioxidant, and the like. It is preferable to use a phosphorus-based antioxidant since coloration occurs to only a small extent.

Examples of the phosphorus-based antioxidant include a monophosphite compound such as triphenyl phosphite, diphenylisodecyl phosphite, phenyldiisodecyl phosphite, tris(nonylphenyl) phosphite, tris(dinonylphenyl) phosphite, tris(2,4-di-t-butylphenyl) phosphite, and 10-(3,5-di-t-butyl-4-hydroxybenzyl)-9,10-dihydro-9-oxa-10-phosphaphenanthrene-10-oxide, a diphosphite compound such as 4,4'-butylidenebis(3-methyl-6-t-butylphenylditridecyl) phosphite and a 4,4'-isopropylidenebis(phenyldialkyl ($C_{12}$-$C_{15}$)) phosphite, 6-[3-(3-t-butyl-4-hydroxy-5-methylphenyl)propoxy]-2,4,8,10-tetrakis-t-butyldibenzo[d,f][1.3.2]dioxaphosphepine, 6-[3-(3,5-di-t-butyl-4-hydroxyphenyl)propoxy]-2,4,8,10-tetrakis-t-butyldibenzo[d,f][1.3.2]dioxaphosphepine, and the like.

Examples of the phenol-based antioxidant include pentaerythrityl-tetrakis[3-(3,5-di-t-butyl-4-hydroxyphenyl) propionate], 2,2-thiodiethylenebis[3-(3,5-di-t-butyl-4-hydroxyphenyl) propionate], octadecyl-3-(3,5-di-t-butyl-4-hydroxyphenyl) propionate, 3,9-bis {2-[3-(3-t-butyl-4-hydroxy-5-methylphenyl) [propionyloxy]]-1,1-dimethylethyl}-2,4,8,10-tetraoxaspiro[5,5]undecane, 1,3,5-trimethyl-2,4,6-tris(3,5-di-t-butyl-4-hydroxybenzyl) benzene, and the like.

Examples of the sulfur-based antioxidant include dilauryl 3,3'-thiodipropionate, dimyristyl 3,3'-thiodipropionate, distearyl 3,3'-thiodipropionate, laurylstearyl 3,3'-thiodipropionate, pentaerythritoltetrakis(β-lauryl thiopropionate), 3,9-bis(2-dodecylthioethyl)-2,4,8,10-tetraoxaspiro[5,5] undecane, and the like.

The antioxidant is normally used in an amount of 0.01 to 2 parts by weight, preferably 0.05 to 1.5 parts by weight, and more preferably 0.1 to 1 part by weight, based on 100 parts by weight of the alkoxysilyl group-containing hydrogenated block copolymer [3]. When the amount of the antioxidant is within the above range, the balance between thermal stability, transparency, and adhesion is improved.

The additive may be uniformly dispersed in the resin composition (that is obtained by mixing the alkoxysilyl group-containing hydrogenated block copolymer [3] and the hydrocarbon-based polymer [4]) using a method that adds a solution prepared by dissolving the additive in an appropriate solvent to a solution of the hydrogenated block copolymer [2] (i.e., a precursor of the alkoxysilyl group-containing hydrogenated block copolymer [3]), removes the solvent to collect the hydrogenated block copolymer [2] including the additive, reacts the hydrogenated block copolymer [2] with the ethylenically unsaturated silane compound in the presence of the peroxide, and adds the hydrocarbon-based polymer [4] to the resulting product; a method that melts the resin composition that includes the alkoxysilyl group-containing hydrogenated block copolymer [3] and the hydrocarbon-based polymer [4] using a twin-screw kneader, a roll, a Brabender, an extruder, or the like, adds the additive to the molten resin composition, and kneads the mixture; a method that kneads and reacts the hydrogenated block copolymer [2] with the ethylenically unsaturated silane compound in the presence of the peroxide, the hydrocarbon-based polymer [4], and the additive; or the like.

Since the resin composition according to one embodiment of the invention includes the alkoxysilyl group-containing hydrogenated block copolymer [3] and the hydrocarbon-based polymer [4], the resin composition exhibits improved melt fluidity. When a crystalline solar cell is sealed using a sheet that is formed using the resin composition, it is possible to prevent occurrence of cracks in the cell during a vacuum lamination process. It is possible to decrease the glass bonding temperature when bonding glass sheets.

The resin composition according to one embodiment of the invention exhibits excellent transparency, excellent heat resistance, excellent light resistance, low hygroscopicity, and low water vapor permeability, and exhibits high adhesion when melted by heating, and bonded to glass or a metal. The resin composition according to one embodiment of the invention maintains low hygroscopicity, non-hydrolyzability, weatherability, and high adhesion to glass or a metal even when exposed to a high-temperature/high-humidity environment for a long time, and exhibits heat resistance and a low-temperature sealing capability.

Therefore, the resin composition according to one embodiment of the invention is useful as a solar cell element sealing material, a glass sheet bonding material (adhesive for laminated glass), a glass sheet-metal sheet bonding material, a metal sheet bonding material, a bonding material for bonding a ceramic substrate or a resin substrate for a high-frequency circuit board to a copper foil that is not roughened, a paper bonding material, an electronic part/electronic device sealing material, an intermediate layer material for thick paper in which an IC device is sealed, an EL display/EL device sealing material, a liquid crystal display sealing material, a ceramic binder, an optical fiber sheath material, a nonwoven fabric, a high-frequency connector, and the like. In particular, the resin composition according to one embodiment of the invention is suitable as a solar cell element sealing material and a glass sheet bonding material (adhesive for laminated glass).

7. Formed Article

A formed article according to one embodiment of the invention is obtained by forming (molding) the resin composition according to one embodiment of the invention.

The resin composition may be formed using an arbitrary method. The resin composition may be formed using a known method. For example, the resin composition may be formed using an injection molding method, an injection compression molding method, a compression molding method, an extrusion method, a blow molding method, an injection blow molding method, an inflation molding method, a T-die extrusion method, a calendering method, a coating method, a vacuum molding method, a foam molding method, a heat lamination molding method, an extrusion lamination molding method, a coextrusion method, a multilayer extrusion method, a matched die method, an SMC molding method, a wire coating extrusion method, a cutting method, or the like.

The shape (form) of the formed article is not particularly limited. The formed article may be a mass, a plate, a sheet, a film, a coating, granules (particles), a powder, a shaped body, an article to which another material is bonded, a laminate that includes another material, a solution, a dispersion, an emulsion, or the like.

The formed article may include another material such as another resin, rubber, an inorganic substance, glass, a metal, paper, or a fabric.

It is preferable that the formed article according to one embodiment of the invention be a sheet-like formed article (sheet) when the formed article is used as a solar cell element sealing material, a glass sheet bonding material (adhesive for laminated glass), or the like (described later).

The sheet may be produced using an arbitrary method. The sheet may be produced using a melt extrusion method (e.g., cast film extrusion method, sheet extrusion method, or inflation molding method), a compression molding method, a calendering molding method, a solution casting method, or the like that is known in the art.

The resin composition according to one embodiment of the invention that is used as an adhesive for laminated glass (hereinafter may be referred to as "resin composition [5]") does not require addition of an organic peroxide that provides thermal crosslinkability, and allows the melt forming temperature to be selected over a wide range. The resin composition is formed into a sheet at a temperature that is appropriately selected taking account of the forming method. For example, when using a melt extrusion molding method, the resin temperature is normally 130 to 250° C., preferably 140 to 230° C., and more preferably 150 to 210° C. If the resin temperature is too low, the fluidity of the resin may deteriorate, and the sheet may have defects (e.g., orange peel or die line). Moreover, it may be difficult to increase the sheet extrusion speed, and industrial productivity may decrease. If the resin temperature is too high, the resulting sheet may exhibit poor adhesion to glass, or a sheet having excellent external appearance may not be obtained due to gelation, or the sheet may show a decrease in sealing capability or adhesion to glass or a metal when stored for a long time in a normal temperature/normal humidity environment due to a decrease in storage stability, for example.

The sheet according to one embodiment of the invention may be a single-layer sheet formed of the resin composition

[5], or may be a multilayer sheet in which a layer formed of the resin composition [5] is stacked on one side or each side of a sheet formed of another transparent resin.

The multilayer sheet may be formed using a two-material/three-layer coextrusion molding method; a method that stacks a layer (sheet) formed of the resin composition [5] on one side or each side of a sheet formed of another transparent resin by thermocompression bonding, or using an adhesive; or the like.

When the sheet according to one embodiment of the invention is a multilayer sheet, the thickness of the layer formed of the resin composition [5] is normally 0.001 mm or more, preferably 0.005 mm or more, and more preferably 0.01 mm or more. When the thickness of the layer formed of the resin composition [5] is within the above range, a sufficient sealing capability and adhesion can be obtained.

The single-layer sheet or the multilayer sheet may have a flat shape, an embossed shape, or the like. The sheet may be stored in a state in which a release film is placed on one side of the sheet in order to prevent a situation in which the sheet undergoes blocking. When the sheet has an embossed shape, the sheet exhibits a good deaeration capability during a vacuum lamination process or a pressurized lamination process using an autoclave, and air bubbles rarely remain in the resulting laminated glass.

The sheet according to one embodiment of the invention is preferably used as a sealing material for a crystalline solar cell that utilizes glass as a transparent front substrate, and an adhesive for laminated glass.

When using the sheet according to one embodiment of the invention as a solar cell element sealing material, and using a crystalline silicon wafer for producing a solar cell element, the thickness of the silicon wafer is 0.15 to 0.2 mm, and the thickness of the sheet (solar cell element sealing material) is normally 0.2 to 0.8 mm, preferably 0.3 to 0.7 mm, and more preferably 0.4 to 0.6 mm. When the thickness of the sheet is within the above range, a filling defect rarely occurs, and an excellent light transmittance is achieved. If the thickness of the sheet is less than 0.2 mm, the crystalline solar cell may break during a heat lamination process when producing a solar cell module. If the thickness of the sheet is more than 0.8 mm, the light transmittance of the sheet may decrease, or the economic efficiency may decrease since it is necessary to use a large amount of the solar cell element sealing material.

Since the sheet according to one embodiment of the invention has a low water vapor transmission rate and low hygroscopicity, it is not indispensable to provide a back-side protective sheet as a waterproof layer. It suffices to provide the back-side protective sheet in order to reduce a mechanical impact, and further improve the durability of the solar cell module. A polyethylene terephthalate resin sheet that exhibits excellent electrical insulating properties, mechanical strength, and the like, and is inexpensive, may be used as the back-side protective sheet.

The back-side protective sheet may have a light-blocking capability and/or a light-reflecting capability. In this case, the back-side protective sheet may include a UV absorber or a light-blocking pigment such as titanium oxide, for example.

When using the sheet according to one embodiment of the invention as an adhesive for laminated glass, glass sheets are bonded in a state in which a sheet formed of the resin composition [5] is interposed between the glass sheets.

When producing laminated glass using the sheet according to one embodiment of the invention as an adhesive, a plurality of glass sheets are provided so that a sheet formed of the resin composition [5] is interposed therebetween, and bonded by heating using an autoclave, a heat-resistant rubber bag that can be decompressed, a vacuum press, a vacuum laminator, or the like.

The thickness of a sheet formed of the resin composition [5] is normally 0.03 to 5 mm. If the thickness of the sheet is less than 0.03 mm, the glass sheets may not be uniformly bonded, and the shatterproof capability and penetration resistance may decrease. If the thickness of the sheet is more than 5 mm, the light transmittance of the sheet may decrease, or it may be necessary to use a large amount of the resin composition [5] (i.e., it may be uneconomical).

The thickness of the glass sheet is not particularly limited, but is normally about 0.5 to 10 mm. Note that it is possible to bond ultrathin glass sheets having a thickness of about 0.03 to 0.4 mm through the resin composition [5] to obtain laminated glass. Since the resin composition [5] maintains flexibility and high adhesion to glass over a wide temperature range from about −50° C. to about +100° C., it is possible to suppress a situation in which glass breaks due to a rapid change in temperature even when a plurality of glass sheets that differ in coefficient of thermal expansion are bonded. Moreover, the resin composition [5] has a shatterproof capability in a normal earth environment.

The type of glass is not particularly limited. Examples of the glass include blue sheet glass, white sheet glass, aluminosilicate glass, aluminoborosilicate glass, uranium glass, potash glass, silicate glass, crystallized glass, germanium glass, quartz glass, soda glass, lead glass, barium borosilicate glass, borosilicate glass, heat-reflecting glass that is coated with an ultrathin metal film, conductive glass that is coated with an ultrathin metal oxide film, and the like.

The value of the laminated glass may be improved by decorating the laminated glass, or providing the laminated glass with a function of blocking electromagnetic waves, radiation, infrared rays, and heat rays, or a display function. For example, a plurality of sheets formed of the resin composition [5] may be provided between two glass sheets in a state in which a colored resin film, a fabric, fibers, Japanese paper, colored paper, a color film, a thin piece of wood, a metal wire, a metal foil, a metal sheet, a wire gauze, a perforated metal, a coloring matter, a dye, a pigment, a multilayer thin film, a shading element, a dimming film, carbon fibers, an acrylic resin sheet, a polycarbonate sheet, an organic EL device, or the like is provided between the plurality of sheets.

The resulting laminated glass may suitably be used as decorative glass; design glass; building door glass, window glass, and roof glass; automotive windshield glass, side glass, rear glass, and sunroof glass; electromagnetic wave-blocking partition glass; noise barrier glass for expressways, railways, and linear motor cars; a transparent solar cell made of glass; an organic EL lighting apparatus; and the like.

EXAMPLES

The invention is further described below by way of examples and comparative examples. Note that the invention is not limited to the following examples. In the examples and comparative examples, the unit "parts" refers to "parts by weight", and the unit "%" refers to "wt %", unless otherwise indicated. The property measurement methods employed in the examples and comparative examples are described below.

(1) Weight Average Molecular Weight (Mw) and Molecular Weight Distribution (Mw/Mn)

The molecular weight of the block copolymer [1], the hydrogenated block copolymer [2], and the hydrocarbon-based polymer [4] was determined by GPC as a standard polystyrene-equivalent value. GPC was performed at 38° C. using THF as an eluant. An HLC-8020 GPC system (manufactured by Tosoh Corporation) was used as the measurement device.

(2) Hydrogenation Ratio

The hydrogenation ratio of the main chain, the side chain, and the aromatic ring of the hydrogenated block copolymer [2] was calculated from the $^1$H-NMR spectrum.

(3) Total Light Transmittance of Sheet

A sheet (thickness: 400 μm) formed by extruding the alkoxysilyl group-containing hydrogenated block copolymer [3], or the resin composition including the alkoxysilyl group-containing hydrogenated block copolymer [3] and the hydrocarbon-based polymer [4] (hereinafter referred to as "resin composition A or the like"), was placed between two polyethylene terephthalate (PET) release films, and pressed with heating at 150° C. for 10 minutes using a vacuum laminator ("PVL0202S" manufactured by Nisshinbo Mechatronics Inc.). The total light transmittance of the sheet was measured in accordance with JIS K 7375.

(4) Water Vapor Transmission Rate

A sheet (thickness: 400 μm) formed by extruding the resin composition A or the like was placed between two PET release films, and pressed with heating at 150° C. for 10 minutes using a vacuum laminator. The water vapor transmission rate of the sheet was measured at 40° C. and 90% RH in accordance with JIS Z 0208.

(5) Evaluation of Adhesion to Glass Substrate (Peel Strength)

A sheet (thickness: 400 μm) formed by extruding the resin composition A or the like was placed on a soda-lime glass substrate (thickness: 2 mm, width: 25 mm, length: 65 mm) so that a non-bonding area was provided at the end of the sheet. The laminate was degassed with heating at a given temperature (140 to 160° C.) for 5 minutes under vacuum, and pressed (bonded) with heating for 10 minutes using a vacuum laminator to prepare a peel test specimen. The surface of the sheet was cut at intervals of 10 mm, and subjected to a 180° peel test at a peel rate of 50 mm/min (from the non-bonding area of the sheet) in accordance with JIS K 6854-1 to measure the peel strength. The initial peel strength after the sheet had been subjected to the vacuum lamination process, and the peel strength after the sheet had been subjected to a high-temperature/high-humidity environment (85° C., 85% RH) for 170 hours, were measured as the peel strength. The higher the peel strength, the better the adhesion to glass is.

(6) Evaluation of Presence or Absence of Cracks in Cell During Production of Solar Cell Module A sheet (thickness: 400 μm) formed by extruding the resin composition A or the like was placed on a transparent substrate (soda-lime glass, 200×200 mm, thickness: 3 mm), and a polycrystalline silicon solar cell (manufactured by Advantec Co., Ltd., 155×155 mm, thickness: 200 μm) (a tab wire (thickness: 200 μm) was connected to each side of the solar cell) was placed on the sheet. A sheet (thickness: 400 μm) formed by extruding the resin composition A or the like, and a PET release film (that was used instead of a back-side protective sheet) were sequentially placed on the solar cell to obtain a laminate. The laminate was degassed for 5 minutes under vacuum, and then pressed (sealed) for 10 minutes at a specific temperature between 140 and 160° C. (at an interval of 5° C.) using a vacuum laminator to obtain a solar cell module. After removing the release film from the solar cell module, the presence or absence of cracks in each solar cell (five solar cells) was observed with the naked eye. A case where cracks were not observed in each solar cell was evaluated as "Acceptable". When cracks were observed, the number of cells in which cracks occurred was counted.

A typical vacuum lamination temperature currently employed for EVA is 150° C. Therefore, cracks should not occur at 150° C.

(7) Evaluation of Heat Resistance of Solar Cell Module

The solar cell module which was produced as described above (see (6)) (sealed at 140° C., 150° C., or 160° C.) and in which cracks were not observed in each solar cell, was held at 120° C. for 48 hours in an oven in a state in which the solar cell module stood upright, and the external appearance (e.g., displacement of the solar cell, the presence or absence of cracks, and deformation of the sealing material) was observed. A case where a change in external appearance was not observed was evaluated as "Acceptable".

(8) Evaluation of Adhesion to Glass Sheet (Laminated Glass) (Peeling Strength)

A sheet formed of the resin composition [5] was placed on white sheet glass (thickness: 2 mm, width: 100 mm, length: 70 mm) so that a non-bonding area was provided at the end of the sheet. The laminate was degassed at 120° C. for 5 minutes under vacuum, and pressed (bonded) for 10 minutes under vacuum using a vacuum laminator to prepare a peel test specimen. The surface of the sheet was cut at intervals of 15 mm, and subjected to a 180° peel test at a peel rate of 50 mm/min (from the non-bonding area of the sheet) in accordance with JIS K 6854-2 to measure the peel strength.

A case where the peel strength was higher than 20 N/cm was evaluated as "Acceptable", a case where the peel strength was 10 to 20 N/cm was evaluated as "Fair", and a case where the peel strength was lower than 10 N/cm was evaluated as "Unacceptable".

(9) Durability

A peel test specimen was prepared in the same manner as described above (see "(8) Evaluation of adhesion to glass sheet (laminated glass) (peeling strength)"), and stored at 85° C. and 85% RH for 1000 hours in a thermo-hygrostat, and the peel strength of the specimen was measured.

A case where the peel strength was higher than 20 N/cm was evaluated as "Acceptable", a case where the peel strength was 10 to 20 N/cm was evaluated as "Fair", and a case where the peel strength was lower than 10 N/cm was evaluated as "Unacceptable".

(10) Light Resistance of Adhesive Sheet for Laminated Glass

A dumbbell-shaped No. 3 specimen in accordance with JIS K 6251 was prepared using a sheet formed of the resin composition [5]. Light was applied to the specimen for 700 hours through white sheet glass (thickness: 3.2 mm) using a xenon weatherometer (black panel temperature: 83° C., irradiance: 60 W/m$^2$, no water exposure), and the tensile strength retention ratio and the elongation retention ratio with respect to the values measured before applying light were calculated.

It was determined that the adhesive sheet had excellent light resistance when the tensile strength retention ratio with respect to the initial value was 80% or more, and the elongation retention ratio with respect to the initial value was 80% or more.

(11) Light Transmittance of Laminated Glass

A sheet formed of the resin composition [5] was placed between two sheets of white sheet glass having a width of 50 mm, a length of 50 mm, and a thickness of 3.2 mm or 1.0 mm. After removing gas at 120° C. for 5 minutes under vacuum using a vacuum laminator, the laminate was pressed for 10 minutes under vacuum to prepare a laminated glass specimen, and the total light transmittance of the laminated glass specimen was measured in accordance with JIS K 7375.

A case where the total light transmittance was 90% or more was evaluated as "Acceptable", and a case where the total light transmittance was less than 90% was evaluated as "Unacceptable".

(12) Heat Resistance of Laminated Glass

A sheet formed of the resin composition [5] was placed between two sheets of white sheet glass having a thickness of 3.2 mm, a width of 200 mm, and a length of 200 mm. After removing gas at 130° C. under vacuum using a vacuum press, the laminate was pressure-bonded for 10 minutes with heating to prepare a laminated glass specimen. The laminated glass specimen was stored at 100° C. for 168 hours in an oven in a state in which only one of the glass sheets was held using a cradle so that the laminated glass specimen stood upright. The laminated glass specimen was then observed with the naked eye to evaluate the external appearance (e.g., displacement, discoloration, air bubbles, and delamination) of the laminated glass specimen.

A case where no abnormalities were observed was evaluated as "Acceptable", and a case where abnormalities were observed was evaluated as "Unacceptable".

(13) Low-Temperature Shatterproof Capability of Laminated Glass

A sheet formed of the resin composition [5] was placed between two sheets of white sheet glass having a thickness of 2.0 mm, a width of 400 mm, and a length of 400 mm. After removing gas from the laminate in a heat-resistant bag, the laminate was pressure-bonded at 130° C. for 1 hour under a pressure of 0.8 MPa using an autoclave for curing a composite material to prepare a laminated glass specimen. The laminated glass specimen was stored in a thermo-hygrostat at −40° C. for 3 hours. A steel ball having a weight of 2 kg was dropped onto the surface of the laminated glass specimen from a height of 2 m immediately after removing the laminated glass specimen from the thermo-hygrostat, and the state of breakage of the laminated glass specimen was observed with the naked eye.

A case where the steel ball did not penetrate the laminated glass, and the glass was not shattered was evaluated as "Acceptable" (i.e., the shatterproof capability was evaluated as "Acceptable").

Reference Example 1

Alkoxysilyl Group-Containing Hydrogenated Block Copolymer [3-a]

Synthesis of Block Copolymer [1-a]

A reactor equipped with a stirrer in which the internal atmosphere had been sufficiently replaced with nitrogen, was charged with 550 parts of dehydrated cyclohexane, 25.0 parts of dehydrated styrene, and 0.475 parts of n-dibutyl ether. 0.99 parts of n-butyllithium (15% cyclohexane solution) was added to the mixture at 60° C. with stirring to initiate polymerization. The mixture was reacted at 60° C. for 60 minutes with stirring to obtain a reaction mixture A. A sample was collected from the reaction mixture A, and subjected to gas chromatography. The polymerization conversion rate determined by gas chromatography was 99.5%.

After the addition of 50.0 parts of dehydrated isoprene to the reaction mixture A, the mixture was stirred at 60° C. for 30 minutes to obtain a reaction mixture B. A sample was collected from the reaction mixture B, and subjected to gas chromatography. The polymerization conversion rate determined by gas chromatography was 99%.

After the addition of 25.0 parts of dehydrated styrene to the reaction mixture B, the mixture was stirred at 60° C. for 60 minutes to obtain a reaction mixture C. A sample was collected from the reaction mixture C, and subjected to gas chromatography. The polymerization conversion rate determined by gas chromatography was about 100%.

0.5 parts of isopropyl alcohol was added to the reaction mixture C to terminate the reaction to obtain a reaction mixture D. The resulting block copolymer included in the reaction mixture D had a weight average molecular weight (Mw) of 48,400 and a molecular weight distribution (Mw/Mn) of 1.02.

Synthesis of Hydrogenated Block Copolymer [2-a]

The reaction mixture D (polymer solution) was transferred to a pressure-resistant reactor equipped with a stirrer. After the addition of 3.0 parts of a nickel catalyst supported on a diatomaceous earth carrier ("T-8400RL" manufactured by Süd-Chemie) (hydrogenation catalyst) and 100 parts of dehydrated cyclohexane, the mixture was mixed (stirred). After replacing the atmosphere inside the reactor with hydrogen gas, hydrogen was supplied to the reactor while stirring the solution to effect a hydrogenation reaction at 190° C. for 6 hours under a pressure of 4.5 MPa to obtain a reaction mixture E. The resulting hydrogenated block copolymer included in the reaction mixture E had a weight average molecular weight (Mw) of 48,900 and a molecular weight distribution (Mw/Mn) of 1.03.

After completion of the hydrogenation reaction, the reaction mixture E was filtered to remove the hydrogenation catalyst. 1.0 part of a solution prepared by dissolving 0.1 parts of pentaerythrityl-tetrakis[3-(3,5-di-t-butyl-4-hydroxyphenyl) propionate] ("Irganox (registered trademark) 1010" manufactured by BASF Japan Ltd.) (phenol-based antioxidant) in xylene was added to (dissolved in) the resulting solution.

After filtering the resulting solution through a metal fiber filter (manufactured by Nichidai Corporation, pore size: 0.4 μm) to remove minute solids, the solvent (cyclohexane and xylene) and other volatile components were removed from the solution at 260° C. under a pressure of 0.001 MPa or less using a cylindrical evaporator ("Kontro" manufactured by Hitachi Ltd.). The residue was extruded in the shape of a strand in a molten state from a die connected to the evaporator, and the extruded product was cooled, and cut using a pelletizer to obtain 96 parts of block copolymer pellets A. The resulting hydrogenated block copolymer [2-a] included in the pellets A had a weight average molecular weight (Mw) of 48,200 and a molecular weight distribution (Mw/Mn) of 1.03. The hydrogenation ratio was about 100%.

Synthesis of Alkoxysilyl Group-Containing Hydrogenated Block Copolymer [3-a]

2.0 parts of vinyltrimethoxysilane and 0.2 parts of 2,5-dimethyl-2,5-di(t-butylperoxy)hexane ("PERHEXA (registered trademark) 25B" manufactured by NOF Corporation) were added to 100 parts of the pellets A. The mixture was kneaded at a resin temperature of 200° C. for a residence time of 60 to 70 seconds using a twin-screw extruder ("TEM-35B" manufactured by Toshiba Machine Co., Ltd.), and extruded in the shape of a strand. The extruded product was air-cooled, and cut using a pelletizer to obtain 97 parts of pellets B of an alkoxysilyl group-containing hydrogenated block copolymer [3-a].

10 parts of the pellets B were dissolved in 100 parts of cyclohexane, and the resulting solution was poured into 400 parts of dehydrated methanol to coagulate the alkoxysilyl group-containing hydrogenated block copolymer [3-a], which was filtered off, and dried at 25° C. under vacuum to isolate 9.5 parts of crumbs of the alkoxysilyl group-containing hydrogenated block copolymer [3-a].

The FT-IR spectrum of the resulting alkoxysilyl group-containing hydrogenated block copolymer [3-a] was measured. An absorption peak attributed to an Si—$OCH_3$ group was observed at 1090 $cm^{-1}$, and an absorption peak attributed to an Si—$CH_2$ group was observed at 825 $cm^{-1}$ and 739 $cm^{-1}$. These absorption peaks differed from those (1075 $cm^{-1}$, 808 $cm^{-1}$, 766 $cm^{-1}$) of vinyltrimethoxysilane. An absorption band based on the proton of a methoxy group was observed at 3.6 ppm in the $^1$H-NMR spectrum (in deuterated chloroform). It was confirmed from the peak area ratio that 1.7 parts of vinyltrimethoxysilane was bonded to 100 parts of the hydrogenated block copolymer [2-a].

Reference Example 2

Alkoxysilyl Group-Containing Hydrogenated Block Copolymer [3-b]

Synthesis of Hydrogenated Block Copolymer [2-b]

90 parts of pellets C of a hydrogenated block copolymer [2-b] were obtained in the same manner as in Reference Example 1, except that 20.0 parts of styrene, 0.79 parts of n-butyllithium (15% cyclohexane solution), 60.0 parts of isoprene, and 20.0 parts of styrene were sequentially added to the reaction system as monomers, and polymerized. The resulting hydrogenated block copolymer [2-b] had a weight average molecular weight (Mw) of 59,600 and a molecular weight distribution (Mw/Mn) of 1.03. The hydrogenation ratio was about 100%.

Synthesis of Alkoxysilyl Group-Containing Hydrogenated Block Copolymer [3-b]

95 parts of pellets D of an alkoxysilyl group-containing hydrogenated block copolymer [3-b] were obtained in the same manner as in Reference Example 1, except that the pellets C obtained as described above were used.

The alkoxysilyl group-containing hydrogenated block copolymer [3-b] was analyzed in the same manner as in Reference Example 1. When the FT-IR spectrum of the alkoxysilyl group-containing hydrogenated block copolymer [3-b] was measured, an absorption peak attributed to an Si—$OCH_3$ group was observed at 1090 $cm^{-1}$, and an absorption peak attributed to an Si—$CH_2$ group was observed at 825 $cm^{-1}$ and 739 $cm^{-1}$. These absorption peaks differed from those (1075 $cm^{-1}$, 808 $cm^{-1}$, 766 $cm^{-1}$) of vinyltrimethoxysilane. An absorption band based on the proton of a methoxy group was observed at 3.6 ppm in the $^1$H-NMR spectrum (in deuterated chloroform). It was confirmed from the peak area ratio that 1.8 parts of vinyltrimethoxysilane was bonded to 100 parts of the hydrogenated block copolymer [2-b].

Example 1

Resin Composition Including Alkoxysilyl Group-Containing Hydrogenated Block Copolymer [3-a] and Polyisobutene [4-a]

0.4 parts of 2-(2H-benzotriazol-2-yl)-4-(1,1,3,3-tetrametylbutyl)phenol ("Tinuvin (registered trademark) 329" manufactured by BASF Japan Ltd.) (UV absorber) was added to 100 parts of the pellets B of the alkoxysilyl group-containing hydrogenated block copolymer [3-a] obtained in Reference Example 1, and the mixture was extruded at a resin temperature of 190° C. using a twin-screw extruder (equipped with a side feeder that can feed liquid) ("TEM37BS" manufactured by Toshiba Machine Co., Ltd.). Note that the mixture was extruded in the shape of a strand while continuously feeding polyisobutene [4-a] ("Nisseki Polybutene HV-300" manufactured by JX Nippon Oil & Energy Corporation, number average molecular weight: 1400) (hydrocarbon-based polymer [4]) from the side feeder in an amount of 10 parts by weight based on 100 parts by weight of the alkoxysilyl group-containing hydrogenated block copolymer [3-a]. The extruded product was air-cooled, and cut using a pelletizer to obtain 102 parts of pellets E of a resin composition [5-aa] including the alkoxysilyl group-containing hydrogenated block copolymer [3-a] and the polyisobutene [4-a].

Extrusion

The pellets E of the resin composition [5-aa] were extruded into a sheet having a thickness of 400 μm using a T-die film melt extrusion device (width of T-die: 300 mm) (provided with an extruder having a screw with a diameter of 25 mm) and a sheet take-up device provided with an embossing roll having a pearskin finish pattern (molten resin temperature: 190° C., T-die temperature: 190° C., roll temperature: 50° C.). The resulting extruded sheet [6-aa] was wound around a roll.

The extruded sheet [6-aa] was evaluated with respect to (3) the total light transmittance, (4) the water vapor transmission rate, (5) adhesion to the glass substrate, (6) the presence or absence of cracks in the cell during production of the solar cell module, and (7) the heat resistance of the solar cell module. The results are shown in Table 1.

Example 2

Resin Composition Including Alkoxysilyl Group-Containing Hydrogenated Block Copolymer [3-b] and Polyisobutene [4-b]

98 parts of pellets F of a resin composition [5-bb] including the alkoxysilyl group-containing hydrogenated block copolymer [3-b] and the polyisobutene [4-b] were obtained in the same manner as in Example 1, except that 100 parts of the alkoxysilyl group-containing hydrogenated block copolymer [3-b] obtained in Reference Example 2 was used as the alkoxysilyl group-containing hydrogenated block copolymer [3], and polyisobutene [4-b] ("Nisseki Polybutene HV-100" manufactured by JX Nippon Oil & Energy Corporation, number average molecular weight: 980) was used as the hydrocarbon-based polymer [4] in an amount of 5 parts by weight based on 100 parts by weight of the alkoxysilyl group-containing hydrogenated block copolymer [3-b].

Extrusion

The pellets F of the resin composition [5-bb] were extruded in the same manner as in Example 1 to obtain a sheet having a thickness of 400 μm. The resulting extruded sheet [6-bb] was wound around a roll.

The extruded sheet [6-bb] was evaluated with respect to (3) the total light transmittance, (4) the water vapor transmission rate, (5) adhesion to the glass substrate, (6) the presence or absence of cracks in the cell during production of the solar cell module, and (7) the heat resistance of the solar cell module. The results are shown in Table 1.

Comparative Example 1

Sheet of Alkoxysilyl Group-Containing Hydrogenated Block Copolymer [3-a]

92 parts of pellets G of a resin composition [5-a] including the alkoxysilyl group-containing hydrogenated block copolymer [3-a] obtained in Reference Example 1 and 2-(2H-benzotriazol-2-yl)-4-(1,1,3,3-tetrametylbutyl)phenol (UV absorber) were obtained in the same manner as in Example 1, except that the polyisobutene [4-a] (hydrocarbon-based polymer [4]) was not added.

Extrusion

The pellets G of the resin composition [5-a] were extruded in the same manner as in Example 1 to obtain a sheet having a thickness of 400 μm. The resulting extruded sheet [6-a] was wound around a roll.

The extruded sheet [6-a] was evaluated with respect to (3) the total light transmittance, (4) the water vapor transmission rate, (5) adhesion to the glass substrate, (6) the presence or absence of cracks in the cell during production of the solar cell module, and (7) the heat resistance of the solar cell module. The results are shown in Table 1.

Comparative Example 2

Sheet of Alkoxysilyl Group-Containing Hydrogenated Block Copolymer [3-b]

93 parts of pellets H of a resin composition [5-b] including the alkoxysilyl group-containing hydrogenated block copolymer [3-b] obtained in Reference Example 2 and 2-(2H-benzotriazol-2-yl)-4-(1,1,3,3-tetrametylbutyl)phenol (UV absorber) were obtained in the same manner as in Example 2, except that the polyisobutene [4-b] (hydrocarbon-based polymer [4]) was not added.

Extrusion

The pellets H of the resin composition [5-b] were extruded in the same manner as in Example 1 to obtain a sheet having a thickness of 400 μm. The resulting extruded sheet [6-b] was wound around a roll.

The extruded sheet [6-b] was evaluated with respect to (3) the total light transmittance, (4) the water vapor transmission rate, (5) adhesion to the glass substrate, (6) the presence or absence of cracks in the cell during production of the solar cell module, and (7) the heat resistance of the solar cell module. The results are shown in Table 1.

Example 3

Production of Laminated Glass Using Resin Composition Including Alkoxysilyl Group-Containing Hydrogenated Block Copolymer [3-a] and Polyisobutene [4-a]

Two glass sheets (soda-lime glass, 200×200×3 (thickness) mm) were bonded under the following conditions using the extruded sheet [6-aa] of the resin composition [5-aa] including the alkoxysilyl group-containing hydrogenated block copolymer [3-a] and the polyisobutene [4-a] (see Example 1).

Specifically, two extruded sheets [6-aa] were placed on one glass sheet, and the other glass sheet was placed thereon to obtain a laminate. The laminate was degassed at 130° C. for 5 minutes under vacuum, and then pressed for 10 minutes using a vacuum laminator to obtain laminated glass.

The external appearance of the resulting laminated glass was observed. No defects (e.g., air bubbles) were observed.

The laminated glass was stored at 100° C. or 120° C. for 170 hours in an oven in a state in which only one of the glass sheets was held using a cradle so that the laminated glass stood upright. The external appearance of the laminated glass was then observed with the naked eye. No abnormalities (e.g., displacement, discoloration, air bubbles, and delamination) were observed.

Comparative Example 3

Production of Laminated Glass Using Alkoxysilyl Group-Containing Hydrogenated Block Copolymer [3-a]

Two glass sheets were bonded in the same manner as in Example 3, except for using the extruded sheet [6-a] (see Comparative Example 1) that was obtained by extruding the resin composition [5-a] including the alkoxysilyl group-containing hydrogenated block copolymer [3-a] and the UV absorber.

The external appearance of the resulting laminated glass was observed. A number of air bubbles were observed, and adhesion was insufficient.

TABLE 1

| | Resin composition | | Example 1 [5-aa] | Example 2 [5-bb] | Comparative Example 1 [5-a] | Comparative Example 2 [5-b] |
|---|---|---|---|---|---|---|
| Properties and test results of sealing sheet | Light transmittance | % | 90 | 90 | 90 | 90 |
| | Water vapor transmission rate (when thickness is 400 μm) | g/m² · day | 1.1 | 1.1 | 1.0 | 1.1 |
| | Peel strength from glass substrate | Initial value N/cm | >20 | >20 | >20 | >20 |
| | | After subjected to 85° C. and 85% RH for 170 h N/cm | >20 | >20 | >20 | >20 |
| Presence or absence of cracks in cell during production of solar cell module | Vacuum lamination temperature | 140° C. | Acceptable | Acceptable | 5/5 | 5/5 |
| | | 145° C. | Acceptable | Acceptable | 5/5 | 3/5 |
| | | 150° C. | Acceptable | Acceptable | 2/5 | Acceptable |
| | | 155° C. | Acceptable | Acceptable | Acceptable | Acceptable |
| | | 160° C. | Acceptable | Acceptable | Acceptable | Acceptable |
| Heat resistance of solar cell module | Vacuum lamination temperature | 140° C. | Acceptable | Acceptable | No sample | |
| | | 150° C. | Acceptable | Acceptable | Acceptable | Acceptable |
| | | 160° C. | Acceptable | Acceptable | Acceptable | Acceptable |

Example 4

Resin Composition Including Alkoxysilyl Group-Containing Hydrogenated Block Copolymer [3-a] and Polyisobutene [4-c]

129 parts of pellets of a resin composition [5-ac] including the alkoxysilyl group-containing hydrogenated block copolymer [3-a] and polyisobutene [4-c] were obtained in the same manner as in Example 1, except that polyisobutene [4-c] ("Nisseki Polybutene HV-1900" manufactured by JX Nippon Oil & Energy Corporation, number average molecular weight: 2900) was used as the hydrocarbon-based polymer [4] in an amount of 40 parts by weight based on 100 parts by weight of the alkoxysilyl group-containing hydrogenated block copolymer [3-a].

Extrusion

The pellets of the resin composition [5-ac] were extruded in the same manner as in Example 1 to obtain a sheet having a thickness of 400 μm. The resulting extruded sheet [6-ac] was wound around a roll.

Two glass sheets were bonded in the same manner as in Example 3, except that the extruded sheet [6-ac] was used.

The external appearance of the resulting laminated glass was observed. No defects (e.g., air bubbles) were observed. The heating test was performed in the same manner as in Example 3 using the resulting laminated glass. No abnormalities (e.g., displacement, discoloration, air bubbles, and delamination) were observed.

The following were confirmed from the results of Examples 1 to 4 and Comparative Examples 1 to 3.

When using the sheet formed of the resin composition including the alkoxysilyl group-containing hydrogenated block copolymer [3] and the hydrocarbon-based polymer [4] (Examples 1 and 2), cracks rarely occurred in the cell when the polycrystalline silicon solar cell was sealed at a given temperature as compared with the case of using the sheet formed of the alkoxysilyl group-containing hydrogenated block copolymer [3] (Comparative Examples 1 and 2) (i.e., the polycrystalline silicon solar cell can be sealed at a lower temperature).

The heat resistance of the solar cell module (in which the polycrystalline silicon solar cell is sealed) was not affected by the hydrocarbon-based polymer [4] at a temperature of 120° C.

It was also confirmed that glass sheets can be bonded at a lower temperature using the sheet formed of the resin composition including the alkoxysilyl group-containing hydrogenated block copolymer [3] and the hydrocarbon-based polymer [4] (Examples 3 and 4), as compared with the case of using the sheet formed of the alkoxysilyl group-containing hydrogenated block copolymer [3] (Comparative Example 3).

The resulting laminated glass maintains heat resistance at a temperature of 120° C.

Reference Example 3

Alkoxysilyl Group-Containing Hydrogenated Block Copolymer [3]-1

Synthesis of Hydrogenated Block Copolymer [2]-1

A polymerization reaction and a hydrogenation reaction were effected in the same manner as in Reference Example 1, except that the amount of n-butyllithium (15% cyclohexane solution) used for polymerization was changed from 0.99 parts to 0.86 parts, and 4.0 parts of a nickel catalyst supported on a diatomaceous earth carrier ("E22U" manufactured by JGC Catalysts and Chemicals Ltd., nickel content (amount of nickel supported): 60%) was used as the hydrogenation catalyst used for hydrogenation instead of 3.0 parts of a nickel catalyst supported on a diatomaceous earth carrier ("T-8400RL" manufactured by Süd-Chemie). The resulting hydrogenated block copolymer [2]-1 had a weight average molecular weight (Mw) of 51,600 and a molecular weight distribution (Mw/Mn) of 1.06.

After completion of the hydrogenation reaction, the hydrogenation catalyst was removed by filtering the reaction solution, and 2.0 parts of a solution prepared by dissolving 0.1 parts of pentaerythrityl-tetrakis[3-(3,5-di-t-butyl-4-hydroxyphenyl) propionate] ("Irganox (registered trademark) 1010" manufactured by BASF) (phenol-based antioxidant) in xylene was added to (dissolved in) the reaction solution.

After filtering the solution sequentially through a Zeta Plus (registered trademark) filter 30H (manufactured by Cuno, pore size: 0.5 to 1 μm) and a metal fiber filter (manufactured by Nichidai Corporation, pore size: 0.4 μm) to remove minute solids, the solvent (cyclohexane and xylene) and other volatile components were removed from the solution at 260° C. under a pressure of 0.001 MPa or less using a cylindrical evaporator (manufactured by Hitachi Ltd.). The residue was extruded in the shape of a strand in a molten state from a die connected to the evaporator, cooled, and cut using a pelletizer to obtain 93 parts of pellets of the hydrogenated block copolymer [2]-1.

The hydrogenated block copolymer [2]-1 had a weight average molecular weight (Mw) of 51,100 and a molecular weight distribution (Mw/Mn) of 1.10. The hydrogenation ratio was about 100%, and the ratio "wA:wB" was 50:50.

Synthesis of Alkoxysilyl Group-Containing Hydrogenated Block Copolymer [3]-1

2.0 parts of vinyltrimethoxysilane and 0.2 parts of 2,5-dimethyl-2,5-di(t-butylperoxy)hexane ("PERHEXA (registered trademark) 25B" manufactured by NOF Corporation) were added to 100 parts of the pellets of the hydrogenated block copolymer [2]-1. The mixture was kneaded at a resin temperature of 200° C. for a residence time of 60 to 70 seconds using a twin-screw extruder, extruded in the shape of a strand, air-cooled, and cut using a pelletizer to obtain 95 parts of pellets of an alkoxysilyl group-containing hydrogenated block copolymer [3]-1.

After dissolving 10 parts of the pellets of the alkoxysilyl group-containing hydrogenated block copolymer [3]-1 in 100 parts of cyclohexane, the solution was poured into 400 parts of dehydrated methanol to coagulate the alkoxysilyl group-containing hydrogenated block copolymer [3]-1. The alkoxysilyl group-containing hydrogenated block copolymer [3]-1 was filtered off, and dried at 25° C. under vacuum to isolate 9.0 parts of crumbs of the alkoxysilyl group-containing hydrogenated block copolymer [3]-1.

The FT-IR spectrum of the alkoxysilyl group-containing hydrogenated block copolymer [3]-1 was measured. An absorption peak attributed to an Si—OCH$_3$ group was observed at 1090 cm$^{-1}$, and an absorption peak attributed to an Si—CH$_2$ group was observed at 825 cm$^{-1}$ and 739 cm$^{-1}$. These absorption peaks were observed at positions that differ from those (1075 cm$^{-1}$, 808 cm$^{-1}$, 766 cm$^{-1}$) of vinyltrimethoxysilane.

An absorption band based on the proton of a methoxy group was observed at 3.6 ppm in the $^1$H-NMR spectrum (in deuterated chloroform). It was confirmed from the peak area ratio that 1.8 parts of vinyltrimethoxysilane was bonded to 100 parts of the hydrogenated block copolymer [2]-1.

Reference Example 4

Alkoxysilyl Group-Containing Hydrogenated Block Copolymer [3]-2

Synthesis of Hydrogenated Block Copolymer [2]-2
92 parts of pellets of a hydrogenated block copolymer [2]-2 were obtained in the same manner as in Reference Example 3, except that 20.0 parts of styrene, 0.84 parts of n-butyllithium (15% cyclohexane solution), 60.0 parts of isoprene, and 20.0 parts of styrene were sequentially added to the reaction system, and polymerized.

The hydrogenated block copolymer [2]-2 had a weight-average molecular weight (Mw) of 52,000 and a molecular weight distribution (Mw/Mn) of 1.12. The hydrogenation ratio was about 100%, and the ratio "wA:wB" was 40:60.
Synthesis of Alkoxysilyl Group-Containing Hydrogenated Block Copolymer [3]-2
2.0 parts of vinyltrimethoxysilane and 0.2 parts of 2,5-dimethyl-2,5-di(t-butylperoxy)hexane were added to 100 parts of the pellets of the hydrogenated block copolymer [2]-2, and the same operation as described above in connection with Reference Example 3 was performed to obtain 94 parts of pellets of an alkoxysilyl group-containing hydrogenated block copolymer [3]-2.

The resulting pellets were analyzed in the same manner as in Reference Example 3. It was confirmed that 1.8 parts of vinyltrimethoxysilane was bonded to 100 parts of the hydrogenated block copolymer [2]-2.

Reference Example 5

Alkoxysilyl Group-Containing Hydrogenated Block Copolymer [3]-3

Synthesis of Hydrogenated Block Copolymer [2]-3
89 parts of pellets of a hydrogenated block copolymer [2]-3 were obtained in the same manner as in Reference Example 3, except that 10.0 parts of styrene, 0.80 parts of n-butyllithium (15% cyclohexane solution), 80.0 parts of isoprene, and 10.0 parts of styrene were sequentially added to the reaction system, and polymerized.

The hydrogenated block copolymer [2]-3 had a weight average molecular weight (Mw) of 53,100 and a molecular weight distribution (Mw/Mn) of 1.11. The hydrogenation ratio was about 100%, and the ratio "wA:wB" was 20:80.
Synthesis of Alkoxysilyl Group-Containing Hydrogenated Block Copolymer [3]-3
2.0 parts of vinyltrimethoxysilane and 0.2 parts of 2,5-dimethyl-2,5-di(t-butylperoxy)hexane were added to 100 parts of the pellets of the hydrogenated block copolymer [2]-3, and the same operation as described above in connection with Reference Example 3 was performed to obtain 85 parts of pellets of an alkoxysilyl group-containing hydrogenated block copolymer [3]-3.

The resulting pellets were analyzed in the same manner as in Reference Example 3. It was confirmed that 1.8 parts of vinyltrimethoxysilane was bonded to 100 parts of the hydrogenated block copolymer [2]-3.

Reference Example 6

Hydrogenated Polyisoprene [4]-3

A reactor equipped with a stirrer in which the internal atmosphere had been sufficiently replaced with nitrogen, was charged with 400 parts of dehydrated cyclohexane, 25.0 parts of dehydrated isoprene, and 7.5 parts of n-dibutyl ether. 20.0 parts of a 15% cyclohexane solution of n-butyllithium was added to the mixture at 60° C. with stirring to initiate polymerization. The mixture was further stirred at 60° C. for 30 minutes.

After the addition of 75.0 parts of dehydrated isoprene in three parts at an interval of 30 minutes, the mixture was stirred for 60 minutes. The polymerization conversion ratio was about 100%.

The reaction was terminated by adding 3.0 parts of isopropyl alcohol.

The resulting polyisoprene had a number average molecular weight (Mn) of 1900 and a molecular weight distribution (Mw/Mn) of 1.04.

The polymer solution was transferred to a pressure-resistant reactor equipped with a stirrer. After the addition of 1.5 parts of a nickel catalyst supported on a diatomaceous earth carrier ("E22U" manufactured by JGC Catalysts and Chemicals Ltd., nickel content (amount of nickel supported): 60%) (hydrogenation catalyst) and 50 parts of dehydrated cyclohexane, the mixture was mixed (stirred). After replacing the atmosphere inside the reactor with hydrogen gas, hydrogen was supplied to the reactor while stirring the solution to effect a hydrogenation reaction at 160° C. for 4 hours under a pressure of 4.5 MPa.

The resulting hydrogenated polyisoprene [4]-3 had a number average molecular weight (Mn) of 1900 and a molecular weight distribution (Mw/Mn) of 1.04.

After completion of the hydrogenation reaction, the hydrogenation catalyst was removed by filtering the reaction solution, and 2.0 parts of a solution prepared by dissolving 0.1 parts of pentaerythrityl-tetrakis[3-(3,5-di-t-butyl-4-hydroxyphenyl) propionate] ("Irganox (registered trademark) 1010" manufactured by BASF) (phenol-based antioxidant) in xylene was added to (dissolved in) the reaction solution.

The solution was filtered through a Zeta Plus (registered trademark) filter 30H (manufactured by Cuno, pore size: 0.5 to 1 μm) to remove minute solids. The filtrate was heated to 50° C. under reduced pressure to evaporate 200 parts of cyclohexane. 500 parts of isopropyl alcohol was added to the concentrated solution to separate hydrogenated polyisoprene as a viscous liquid. After removing the supernatant liquid, volatile components were removed at 120° C. for 24 hours under reduced pressure to obtain 76 parts of hydrogenated polyisoprene.

The resulting hydrogenated polyisoprene [4]-3 had a number average molecular weight (Mn) of 2000, a molecular weight distribution (Mw/Mn) of 1.03, and an iodine number of 0.2.

Reference Example 7

Hydrogenated Polyisoprene [4]-4

70 parts of hydrogenated polyisoprene was obtained in the same manner as in Reference Example 6, except that the hydrogenation time was changed to 2.5 hours.

The resulting hydrogenated polyisoprene [4]-4 had a number average molecular weight (Mn) of 2100, a molecular weight distribution (Mw/Mn) of 1.04, and an iodine number of 1.3.

Reference Example 8

Hydrogenated Polyisoprene [4]-5

67 parts of hydrogenated polyisoprene [4]-5 was obtained in the same manner as in Reference Example 6, except that the amount of the hydrogenation catalyst was changed to 1.0 part.

The resulting hydrogenated polyisoprene [4]-5 had a number average molecular weight (Mn) of 2100, a molecular weight distribution (Mw/Mn) of 1.04, and an iodine number of 2.5.

Example 5

Preparation of Resin Composition [5]-1 Including Alkoxysilyl Group-Containing Hydrogenated Block Copolymer [3]-1 and Hydrogenated Polyisobutene [4]-1

0.4 parts of 2-(3,5-dicumyl-2-hydroxyphenyl)-2H-benzotriazole ("Tinuvin (registered trademark) 234" manufactured by BASF Japan Ltd.) (UV absorber) was added to 100 parts of the pellets of the alkoxysilyl group-containing hydrogenated block copolymer [3]-1 obtained in Reference Example 3, and the mixture was homogenously mixed, and extruded at a resin temperature of 190° C. using a twin-screw extruder (equipped with a side feeder that can feed liquid) ("TEM37BS" manufactured by Toshiba Machine Co., Ltd.).

Note that the mixture was extruded in the shape of a strand while continuously feeding hydrogenated polyisobutene [4]-1 ("PARLEAM (registered trademark) 24" manufactured by NOF Corporation, iodine number: 0.5, number average molecular weight: 2200) from the side feeder in an amount of 20 parts by weight based on 100 parts by weight of the alkoxysilyl group-containing hydrogenated block copolymer [3]-1. The extruded product was air-cooled, and cut using a pelletizer to obtain 113 parts of pellets of a resin composition [5]-1 including the alkoxysilyl group-containing hydrogenated block copolymer [3]-1 and the hydrogenated polyisobutene [4]-1.
Extrusion The pellets of the resin composition [5]-1 were extruded into a sheet [6]-1 having a thickness of 400 μm and a width of 450 mm using a T-die film molding device (width of T-die: 600 mm) (provided with an extruder having a screw with a diameter of 40 mm) and a sheet take-up device provided with an embossing roll having a pearskin finish pattern (molten resin temperature: 190° C., T-die temperature: 190° C., roll temperature: 50° C.). The embossing shape was transferred to the resulting sheet. The sheet was wound around a roll.

The extruded sheet [6]-1 was evaluated with respect to (8) adhesion to the glass substrate, (9) durability, (10) light resistance, (11) light transmittance, (12) heat resistance, and (13) shatterproof capability.

The evaluation results are shown in Table 3.

Example 6

Preparation of Resin Composition [5]-3

111 parts of pellets of a resin composition [5]-3 were obtained in the same manner as in Example 5, except that the hydrogenated polyisoprene [4]-3 obtained in Reference Example 6 was used instead of the hydrogenated polyisobutene [4]-1 in an amount of 20 parts based on 100 parts of the alkoxysilyl group-containing hydrogenated block copolymer [3]-1.
Extrusion The pellets of the resin composition [5]-3 were extruded in the same manner as in Example 5 to obtain a sheet [6]-3 having a thickness of 400 μm and a width of 450 mm.

The extruded sheet [6]-3 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Example 7

Preparation of Resin Composition [5]-4

108 parts of pellets of a resin composition [5]-4 were obtained in the same manner as in Example 5, except that the hydrogenated polyisoprene [4]-4 obtained in Reference Example 7 was used instead of the hydrogenated polyisobutene [4]-1 in an amount of 20 parts based on 100 parts of the alkoxysilyl group-containing hydrogenated block copolymer [3]-1.
Extrusion The pellets of the resin composition [5]-4 were extruded in the same manner as in Example 5 to obtain a sheet [6]-4 having a thickness of 400 μm and a width of 450 mm.

The extruded sheet [6]-4 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Comparative Example 4

Preparation of Resin Composition [5]-6

95 parts of pellets of a resin composition [5]-6 were obtained in the same manner as in Example 5, except that the hydrogenated polyisobutene [4]-1 was not used, and the resin temperature in the twin-screw extruder was changed to 210° C.
Extrusion The pellets of the resin composition [5]-6 were extruded in the same manner as in Example 5, except that the molten resin temperature was changed to 210° C., the T-die temperature was changed to 210° C., and the roll temperature was changed to 65° C., to obtain a sheet [6]-6 having a thickness of 400 μm and a width of 450 mm.

The extruded sheet [6]-6 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Example 8

Preparation of Resin Composition [5]-7

103 parts of pellets of a resin composition [5]-7 were obtained in the same manner as in Example 5, except that the pellets of the alkoxysilyl group-containing hydrogenated block copolymer [3]-2 obtained in Reference Example 4 were used instead of the alkoxysilyl group-containing hydrogenated block copolymer [3]-1, and the hydrogenated polyisobutene [4]-1 was used in an amount of 10 parts based on 100 parts of the alkoxysilyl group-containing hydrogenated block copolymer [3]-2.

Extrusion

The pellets of the resin composition [5]-7 were extruded in the same manner as in Example 5 to obtain a sheet [6]-7 having a thickness of 400 μm and a width of 450 mm.

The extruded sheet [6]-7 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Example 9

Preparation of Resin Composition [5]-2

108 parts of pellets of a resin composition [5]-2 were obtained in the same manner as in Example 5, except that unhydrogenated polyisobutene [4]-2 ("Nisseki Polybutene HV-300" manufactured by JX Nippon Oil & Energy Corporation, iodine number: 17.7, number average molecular weight: 1400) was used instead of the hydrogenated polyisobutene [4]-1 in an amount of 15 parts based on 100 parts of the alkoxysilyl group-containing hydrogenated block copolymer [3]-1.

Extrusion

The pellets of the resin composition [5]-2 were extruded in the same manner as in Example 5 to obtain a sheet [6]-2 having a thickness of 400 μm and a width of 450 mm.

The extruded sheet [6]-2 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Example 10

Preparation of Resin Composition [5]-5

112 parts of pellets of a resin composition [5]-5 were obtained in the same manner as in Example 5, except that the hydrogenated polyisoprene [4]-5 obtained in Reference Example 8 was used instead of the hydrogenated polyisobutene [4]-1 in an amount of 20 parts based on 100 parts of the alkoxysilyl group-containing hydrogenated block copolymer [3]-1.

Extrusion

The pellets of the resin composition [5]-5 were extruded in the same manner as in Example 5 to obtain a sheet [6]-5 having a thickness of 400 μm and a width of 450 mm.

The extruded sheet [6]-5 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Comparative Example 5

Preparation of Resin Composition [5]-8

93 parts of pellets of a resin composition [5]-8 were obtained in the same manner as in Example 5, except that the hydrogenated polyisobutene [4]-1 was not used, and the resin temperature in the twin-screw extruder was changed to 200° C.

Extrusion

The pellets of the resin composition [5]-8 were extruded in the same manner as in Example 5, except that the molten resin temperature was changed to 200° C., the T-die temperature was changed to 200° C., and the roll temperature was changed to 60° C., to obtain a sheet [6]-8 having a thickness of 400 μm and a width of 450 mm.

The extruded sheet [6]-8 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Comparative Example 6

Preparation of Resin Composition [5]-9

82 parts of pellets of a resin composition [5]-9 were obtained in the same manner as in Example 5, except that the hydrogenated polyisobutene [4]-1 was not used, and the resin temperature in the twin-screw extruder was set to 190° C.

Extrusion

The pellets of the resin composition [5]-9 were extruded in the same manner as in Example 5, except that the molten resin temperature was set to 190° C., the T-die temperature was set to 190° C., and the roll temperature was changed to 30° C., to obtain a sheet [6]-9 having a thickness of 400 μm and a width of 450 mm. The sheet was wound around a roll in a state in which an anti-blocking PET film was provided.

The extruded sheet [6]-9 was evaluated in the same manner as in Example 5 with respect to (8) adhesion to the glass substrate, (9) durability, (10) light resistance, (11) light transmittance, (12) heat resistance, and (13) shatterproof capability.

The evaluation results are shown in Table 3.

Table 2 shows the types and the amounts of the alkoxysilyl group-containing hydrogenated block copolymer [3] and the hydrocarbon-based polymer [4] used in Examples 5 to 10 and Comparative Examples 4 to 6.

TABLE 2

| | | Example 5 [5]-1 | Example 6 [5]-3 | Example 7 [5]-4 | Example 8 [5]-7 | Example 9 [5]-2 | Example 10 [5]-5 | Comparative Example 4 [5]-6 | Comparative Example 5 [5]-8 | Comparative Example 6 [5]-9 |
|---|---|---|---|---|---|---|---|---|---|---|
| [3]-1 | wA:wB = 50:50 | 100 | 100 | 100 | | 100 | 100 | 100 | | |
| [3]-2 | wA:wB = 40:60 | | | | 100 | | | | 100 | |
| [3]-3 | wA:wB = 20:80 | | | | | | | | | 100 |
| [4]-1 | Iodine number: 0.5 | 20 | | | 10 | | | | | |

TABLE 2-continued

|  |  | Example 5 [5]-1 | Example 6 [5]-3 | Example 7 [5]-4 | Example 8 [5]-7 | Example 9 [5]-2 | Example 10 [5]-5 | Comparative Example 4 [5]-6 | Comparative Example 5 [5]-8 | Comparative Example 6 [5]-9 |
|---|---|---|---|---|---|---|---|---|---|---|
| [4]-2 | Iodine number: 17.7 |  |  |  |  | 15 |  |  |  |  |
| [4]-3 | Iodine number: 0.2 |  | 20 |  |  |  |  |  |  |  |
| [4]-4 | Iodine number: 1.3 |  |  | 20 |  |  |  |  |  |  |
| [4]-5 | Iodine number: 2.5 |  |  |  |  |  | 20 |  |  |  |

TABLE 3

|  |  |  | Example 5 | Example 6 | Example 7 | Example 8 | Example 9 | Example 10 |
|---|---|---|---|---|---|---|---|---|
| Evaluation of resin composition | Adhesion to glass sheet | Peel strength | Acceptable | Acceptable | Acceptable | Acceptable | Acceptable | Acceptable |
|  | Durability | Peel strength | Acceptable | Acceptable | Acceptable | Acceptable | Acceptable | Acceptable |
|  | Light resistance | Tensile strength retention ratio (%) | 110 | 108 | 113 | 109 | 65 | 92 |
|  |  | Elongation retention ratio (%) | 84 | 87 | 83 | 84 | 53 | 68 |
| Evaluation of laminated glass | Total light transmittance (%) |  | 91 | 91 | 91 | 91 | 91 | 91 |
|  |  |  | Acceptable | Acceptable | Acceptable | Acceptable | Acceptable | Acceptable |
|  | Heat resistance |  | Acceptable | Acceptable | Acceptable | Acceptable | Acceptable | Acceptable |
|  | Low-temperature shatterproof capability | Penetration | Acceptable | Acceptable | Acceptable | Acceptable | Acceptable | Acceptable |
|  |  | Shattering | Acceptable | Acceptable | Acceptable | Acceptable | Acceptable | Acceptable |
|  |  |  | Acceptable | Acceptable | Acceptable | Acceptable | Acceptable | Acceptable |

|  |  |  | Comparative Example 4 | Comparative Example 5 | Comparative Example 6 |
|---|---|---|---|---|---|
| Evaluation of resin composition | Adhesion to glass sheet | Peel strength | Unacceptable | Unacceptable | Acceptable |
|  | Durability | Peel strength | Unacceptable | Fair | Acceptable |
|  | Light resistance | Tensile strength retention ratio (%) | 110 | 103 | 102 |
|  |  | Elongation retention ratio (%) | 88 | 90 | 94 |
| Evaluation of laminated glass | Total light transmittance (%) |  | 91 | 91 | 91 |
|  |  |  | Acceptable | Acceptable | Acceptable |
|  | Heat resistance |  | Acceptable | Acceptable | Unacceptable |
|  | Low-temperature shatterproof capability | Penetration | Acceptable | Acceptable | Acceptable |
|  |  | Shattering | Unacceptable | Unacceptable | Acceptable |
|  |  |  | Unacceptable | Unacceptable | Acceptable |

The following were confirmed from the results shown in Table 3.

When using the hydrocarbon-based polymer [4] in combination with the alkoxysilyl group-containing hydrogenated block copolymer [3] (Examples 5 to 10), the glass bonding temperature can be reduced while maintaining transparency, durability, heat resistance, and low-temperature shatterproof capability.

When a hydrogenated (co)polymer of an olefin and/or a conjugated diene that has an iodine number of 2.0 or less is used as the hydrocarbon-based polymer [4] (Examples 5 to 8), it is possible to obtain laminated glass that exhibits excellent light resistance in addition to the above properties.

When the hydrocarbon-based polymer [4] is not used in combination with the alkoxysilyl group-containing hydrogenated block copolymer [3] (Comparative Examples 4 and 5), adhesion to glass was insufficient at 120° C., and durability and low-temperature shatterproof capability were poor.

A decrease in heat resistance occurred when the ratio of the polymer block [A] including a repeating unit derived from an aromatic vinyl compound was reduced in order to obtain sufficient adhesion to glass at 120° C. (Comparative Example 6).

INDUSTRIAL APPLICABILITY

The resin composition according to the embodiments of the invention and the formed article obtained using the resin composition are useful for sealing a solar cell element, and bonding glass.

REFERENCE SIGNS LIST

1 Transparent front substrate
2 Solar cell element
3 Sealing material
4 Tab wire
5 Back-side protective sheet

The invention claimed is:
1. A resin composition comprising an alkoxysilyl group-containing hydrogenated block copolymer [3], and a hydrocarbon-based polymer [4] having a number average molecular weight of 300 to 5000, wherein
the resin composition comprises the hydrocarbon-based polymer [4] in an amount of 1 to 50 parts by weight based on 100 parts by weight of the alkoxysilyl group-containing hydrogenated block copolymer [3], the alkoxysilyl group-containing hydrogenated block copolymer [3] being obtained by introducing an alkoxysilyl group into a hydrogenated block copolymer [2] that is obtained by hydrogenating 90% or more of unsaturated bonds of the main chain, the side chain, and the aromatic ring of a block copolymer [1] that comprises at least two polymer blocks [A] and at least one polymer block [B], the polymer block [A] comprising a repeating unit derived from an aromatic vinyl compound as a main component, the polymer block [B] comprising a repeating unit derived from a linear conjugated diene compound as a main component, a ratio (wA:wB) of a weight fraction wA of the polymer block [A] in the block copolymer [1] to a weight fraction wB of the polymer block [B] in the block copolymer [1] is 30:70 to 65:35, and the hydrocarbon-based polymer [4] is a hydrogenated (co)polymer of an olefin and/or a conjugated diene that has an iodine number of 2.0 or less.

2. The resin composition according to claim 1, wherein the hydrogenated (co)polymer of an olefin and/or a conjugated diene that has an iodine number of 2.0 or less is at least one member selected from the group consisting of a hydrogenated polyisobutylene, a hydrogenated polybutene, a hydrogenated poly-4-methylpentene, a hydrogenated poly-1-octene, a hydrogenated ethylene-α-olefin copolymer, a hydrogenated aliphatic hydrocarbon resin, a hydrogenated alicyclic hydrocarbon resin, and a hydrogenated polyisoprene.

3. The resin composition according to claim 1, wherein the iodine number of the hydrogenated (co)polymer of an olefin and/or a conjugated diene is 1.3 or less.

4. A formed article obtained by forming the resin composition according to claim 1 into a shape.

5. The formed article according to claim 4, wherein the shape is a sheet.

6. The resin composition according to claim 1, wherein the iodine number of the hydrogenated (co)polymer of an olefin and/or a conjugated diene is in a range of from 0.2 to 1.3.

7. The resin composition according to claim 1, wherein the hydrogenated (co)polymer of an olefin and/or a conjugated diene that has an iodine number of 2.0 or less includes a hydrogenated polybutene.

8. The resin composition according to claim 1, wherein the hydrogenated (co)polymer of an olefin and/or a conjugated diene that has an iodine number of 2.0 or less includes a hydrogenated polyisobutene.

9. The resin composition according to claim 1, wherein the hydrogenated (co)polymer of an olefin and/or a conjugated diene that has an iodine number of 2.0 or less includes a hydrogenated polyisoprene.

10. A method of bonding glass sheets, the method comprising:
interposing a glass sheet bonding material between glass sheets and bonding the glass sheets; wherein glass sheet bonding material includes the resin composition of claim 1.

11. The method according to claim 10, wherein interposing a glass sheet bonding material between glass sheets comprises forming the glass sheet bonding material into a sheet and interposing the sheet of the glass sheet bonding material between the glass sheets.

12. The method according to claim 10, wherein the hydrogenated (co)polymer of an olefin and/or a conjugated diene that has an iodine number of 2.0 or less is at least one member selected from the group consisting of a hydrogenated polyisobutylene, a hydrogenated polybutene, a hydrogenated poly-4-methylpentene, a hydrogenated poly-1-octene, a hydrogenated ethylene-α-olefin copolymer, a hydrogenated aliphatic hydrocarbon resin, a hydrogenated alicyclic hydrocarbon resin, and a hydrogenated polyisoprene.

13. The method according to claim 10, wherein the iodine number of the hydrogenated (co)polymer of an olefin and/or a conjugated diene is 1.3 or less.

14. The method according to claim 10, wherein the iodine number of the hydrogenated (co)polymer of an olefin and/or a conjugated diene is in a range of from 0.2 to 1.3.

15. The method according to claim 10, wherein the hydrogenated (co)polymer of an olefin and/or a conjugated diene that has an iodine number of 2.0 or less includes a hydrogenated polybutene.

16. The method according to claim 10, wherein the hydrogenated (co)polymer of an olefin and/or a conjugated diene that has an iodine number of 2.0 or less includes a hydrogenated polyisobutene.

17. The method according to claim 10, wherein the hydrogenated (co)polymer of an olefin and/or a conjugated diene that has an iodine number of 2.0 or less includes a hydrogenated polyisoprene.

* * * * *